United States Patent
Yoshida et al.

(10) Patent No.: US 8,067,819 B2
(45) Date of Patent: Nov. 29, 2011

(54) SEMICONDUCTOR WAFER INCLUDING SEMICONDUCTOR CHIPS DIVIDED BY SCRIBE LINE AND PROCESS-MONITOR ELECTRODE PADS FORMED ON SCRIBE LINE

(75) Inventors: Masaaki Yoshida, Hyogo (JP); Satoshi Kouno, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 337 days.

(21) Appl. No.: 11/794,649

(22) PCT Filed: Nov. 22, 2006

(86) PCT No.: PCT/JP2006/023872
§ 371 (c)(1),
(2), (4) Date: Jul. 2, 2007

(87) PCT Pub. No.: WO2007/061124
PCT Pub. Date: May 31, 2007

(65) Prior Publication Data
US 2009/0272973 A1    Nov. 5, 2009

(30) Foreign Application Priority Data

Nov. 24, 2005  (JP) .................................. 2005-339456
Jan. 13, 2006  (JP) .................................. 2006-006742

(51) Int. Cl.
*H01L 23/544*    (2006.01)
(52) U.S. Cl. ................. 257/620; 257/619; 257/E21.599; 438/18; 438/33; 438/68; 438/114
(58) Field of Classification Search .................. 257/620, 257/E21.599, 619; 438/33, 68, 114, 18
See application file for complete search history.

(56) References Cited

U.S. PATENT DOCUMENTS

| 4,197,632 A | 4/1980 | Aomura |
| 5,477,062 A | 12/1995 | Natsume |
| 6,159,826 A * | 12/2000 | Kim et al. ..................... 438/460 |
| 6,194,235 B1 * | 2/2001 | Ma .................. 438/14 |
| 6,365,443 B1 * | 4/2002 | Hagiwara et al. ............. 438/130 |
| 2002/0084512 A1 | 7/2002 | Terada et al. |

(Continued)

FOREIGN PATENT DOCUMENTS

| JP | 57-107043 | 7/1982 |
| JP | 3-139862 | 6/1991 |
| JP | 9-45637 | 2/1997 |

(Continued)

OTHER PUBLICATIONS

Oct. 6, 2010 European search report in connection with counterpart European patent application No. 06833675.

*Primary Examiner* — Thanh V Pham
*Assistant Examiner* — Maria Ligai
(74) *Attorney, Agent, or Firm* — Cooper & Dunham LLP

(57) ABSTRACT

The present invention discloses a semiconductor wafer having a scribe line dividing the semiconductor wafer into a matrix of plural semiconductor chips. The semiconductor wafer includes a polysilicon layer, a poly-metal interlayer insulation film formed on the polysilicon layer, and a first metal wiring layer formed on the poly-metal interlayer insulation film. The semiconductor wafer includes a process-monitor electrode pad formed on a dicing area of the scribe line. The process-monitor electrode pad has a width greater than the width of the dicing area. The process-monitor electrode pad includes a contact hole formed in the poly-metal insulation film for connecting the first metal wiring layer to the polysilicon layer.

12 Claims, 21 Drawing Sheets

U.S. PATENT DOCUMENTS

| | | | |
|---|---|---|---|
| 2002/0179927 A1* | 12/2002 | Lu et al. | 257/151 |
| 2003/0153172 A1* | 8/2003 | Yajima et al. | 438/612 |
| 2004/0012093 A1* | 1/2004 | Koubuchi et al. | 257/776 |
| 2004/0038542 A1* | 2/2004 | Chan et al. | 438/705 |
| 2005/0202650 A1* | 9/2005 | Imori et al. | 438/462 |
| 2005/0230005 A1* | 10/2005 | Liang et al. | 148/33.3 |

FOREIGN PATENT DOCUMENTS

| | | |
|---|---|---|
| JP | 2861264 | 12/1998 |
| JP | 2002-190456 | 7/2002 |
| JP | 2004-214699 | 7/2004 |
| JP | 2005-191334 | 7/2005 |

* cited by examiner

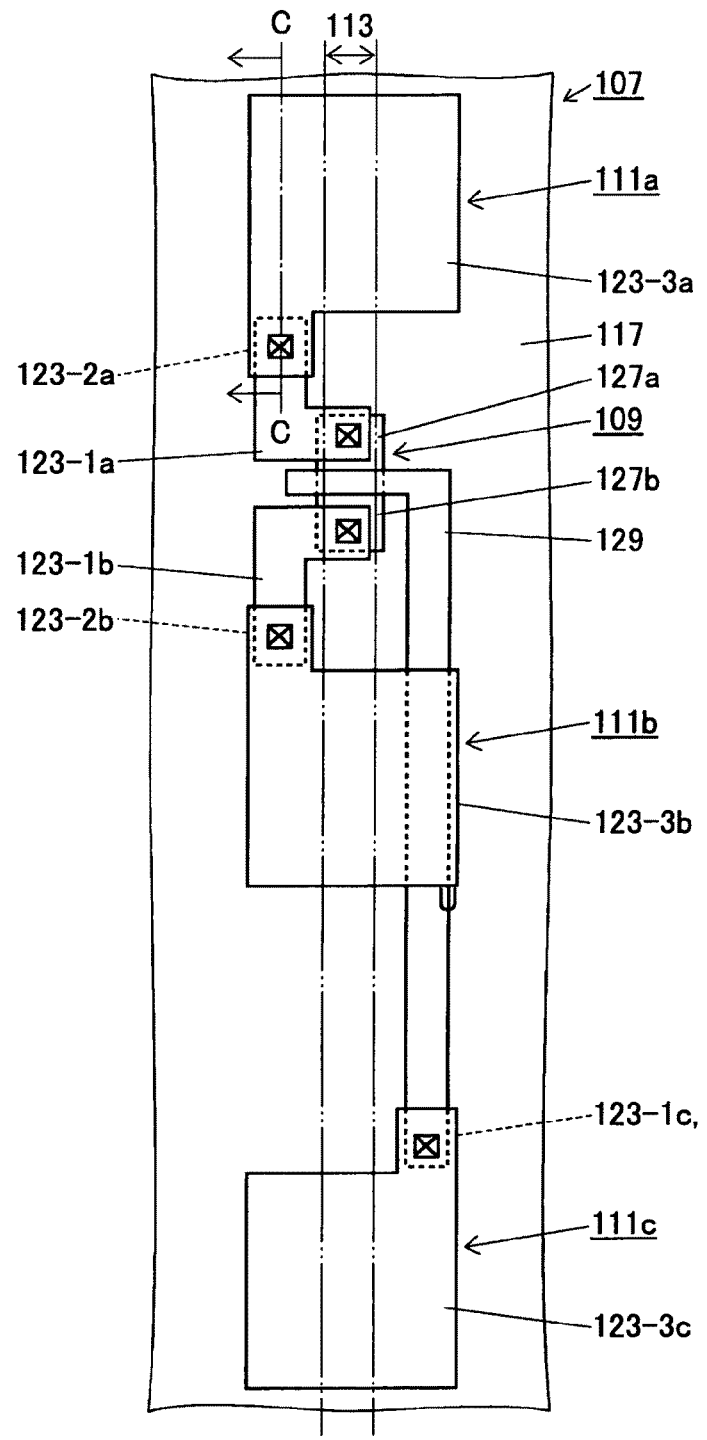
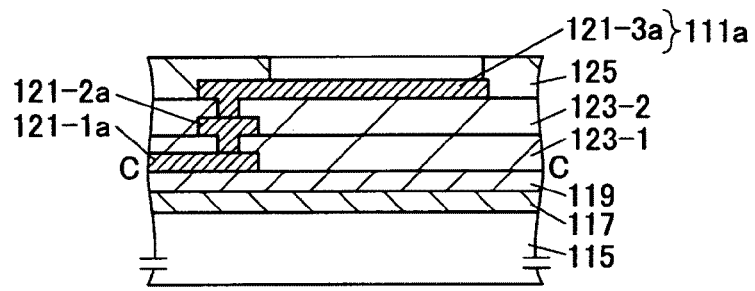
FIG. 19A
FIG. 19B

SEMICONDUCTOR WAFER INCLUDING SEMICONDUCTOR CHIPS DIVIDED BY SCRIBE LINE AND PROCESS-MONITOR ELECTRODE PADS FORMED ON SCRIBE LINE

TECHNICAL FIELD

The present invention relates to a semiconductor wafer, and more particularly to a semiconductor wafer having plural semiconductor chips divided by a scribe line and process-monitor electrode pads formed on the scribe line.

BACKGROUND ART

In a typical dicing process of a semiconductor wafer (dicing target) for separating plural semiconductor chips from the semiconductor wafer, an annular blade having, for example, diamond particles adhered thereto is rotated at high speed and makes contact upon a scribe line formed on the semiconductor wafer. By the rotating blade making contact upon the scribe line, the semiconductor wafer is diced into plural semiconductor chips. In order to achieve better dicing performance, various parameters are optimized. The parameters include, for example, the thickness of the blade, the rotational speed of the blade, the stage speed, and the depth of the cut.

The semiconductor wafer has a layered configuration with various thin films formed on a silicon substrate and is not formed with a uniform material with respect to the thickness direction of the semiconductor wafer. More specifically, the semiconductor wafer includes metal wiring that is formed of a metal material mainly comprising aluminum material (widely used as wiring of semiconductor chips). The material of the metal wiring has a characteristic different from that of the silicon material of the silicon substrate.

Furthermore, the semiconductor wafer has a process-monitor provided on a scribe line of the semiconductor wafer for inspecting the performance of the semiconductor chips of the semiconductor wafer. The process-monitor includes a process-monitor electrode pad for evaluating the electrical characteristics of a process-monitored semiconductor device. The process-monitoring pad is also formed of a metal material. Therefore, in a process of dicing the semiconductor wafer, a layered configuration including a silicon substrate, an insulation film, and a metal material is diced.

FIGS. 15A and 15B are diagrams for showing the vicinity of a scribe line of a conventional semiconductor wafer. FIG. 15A is a plan view of the conventional semiconductor wafer. FIG. 15B is a cross-sectional view taken along line W-W of FIG. 15A.

A LOCOS (Local Oxidation of Silicon) oxide film 17 is formed on a semiconductor substrate 15. A BPSG (Boro-Phospho silicate glass) film 19 is formed on the LOCOS oxide film 17.

A first metal wiring layer 21-1 is formed on the BPSG film 19. The first metal wiring layer 21-1 is situated in the area where a process-monitor electrode pad 31 is formed. Furthermore, in the area illustrated in the drawing, the first metal wiring layer 21-1 is formed in an annular shape along a peripheral part of the semiconductor chip 3.

A first interlayer insulation film 23-1 is formed on the BPSG film 19 and also on the first metal wiring layer 21-1. A through-hole is formed in the first interlayer insulation film 23-1 on the first metal wiring layer 21-1 in the area where the process-monitor electrode pad 31 is formed. Furthermore, an annular through-hole is formed in the first interlayer insulation film 23-1 on the first metal wiring layer 21-1 along a peripheral part of the semiconductor chip 3.

A second metal wiring layer 21-2 is formed on the first interlayer insulation film 23-1. The second metal wiring layer 21-2 is situated in the area where the process-monitor electrode pad 31 is formed and in the through-hole thereof. Furthermore, in the area illustrated in the drawing, the second metal wiring layer 21-2 is formed in an annular shape along a peripheral part of the semiconductor chip 3.

A second interlayer insulation film 23-2 is formed on the first interlayer insulation film 23-1 and also on the second metal wiring layer 21-2. A through-hole is formed in the second interlayer insulation film 23-2 on the second metal wiring layer 21-2 in the area where the process-monitor electrode pad 31 is formed. Furthermore, an annular through-hole is formed in the second interlayer insulation film 23-2 on the second metal wiring layer 21-2 along a peripheral part of the semiconductor chip 3.

A third metal wiring layer 21-3 is formed on the second interlayer insulation film 23-2. The third metal wiring layer 21-3 is situated on the second interlayer insulation film 23-2 of the area where the process-monitor electrode pad 31 is formed and in the through-hole thereof. Furthermore, in the area illustrated in the drawing, the third metal wiring layer 21-3 is formed in an annular shape on the second interlayer insulation film 23-2 and in the through-hole along a peripheral part of the semiconductor chip 3.

A final protective layer 25 is formed on the second interlayer insulation film 23-2 and on the third metal wiring layer 21-3. A pad opening part is formed in the final protective layer 25 in the area where the process-monitor electrode pad 31 is formed. Thereby, the surface of the third metal wiring layer 21-3 is in an exposed state.

The above-described metal wiring layers 21-1, 21-2, and 21-3 situated in the vicinity of the peripheral part of the semiconductor chip 3 together form a guard ring 21.

In a dicing process, it is generally difficult to dice (cut) plural films formed of different materials at a single time and the dicing tends to lead to a problem of the creation of metal burrs. Normally, since a process-monitor semiconductor device situated in a dicing line is relatively small in size, the process-monitor semiconductor device can be thoroughly diced without any metal burr in a case where, for example, a blade having a thickness of 20-50 µm is employed. Meanwhile, since a process-monitor electrode pad has a width of at least 60 µm or more, the width of the process-monitor electrode pad will be greater than the thickness of such blade (width of the dicing area). This results in the problem of metal burrs.

This problem could be overcome by making adjustments in the dicing process in a case of employing a design rule referred to as a half-micron process which is applied to two-three wiring layers.

However, in recent years and continuing, there is a significant increase in forming multiple layers of metal wiring since semiconductor devices are fabricated in finer sizes (for example, fabricating a semiconductor device having seven-eight wiring layers is not unusual). Accordingly, in a case where plural layers of metal wiring are provided as a process-monitor electrode pad on a scribe line, the metal film(s) included in the process-monitor electrode pad causes metal burrs.

Furthermore, in recent years and continuing, various methods of planarization technology of an insulation film are used for solving the problem of focus depth in a case of using photolithography technology. The method of planarizing the surface of an insulation film may be, for example, using a CMP (Chemical Mechanical Polishing) method, or employing a BPSG film as the film between a polysilicon layer and a metal layer. The BPSG film, which is an insulation film formed by including boron and phosphorous into a silicon oxide layer, is fabricated by employing a CVD (Chemical Vapor Deposition) method. By increasing the concentration of boron and/or phosphorous, the surface of the insulation film can be suitably planarized. Therefore, the concentration of boron and/or phosphorous is increased to reduce the size of semiconductor devices.

However, the inventor of the present invention found that the adhesion between the BPSG film and the metal wiring layer (more specifically, between the BPSG film and a titanium film serving as a substrate of an aluminum alloy and having a high melting point) becomes weaker as the concentration of boron and/or phosphorous in the BPSG film is increased. This is because the increase in the concentration of boron and/or phosphorous not only promotes planarization, but at the same time, reduces the micro-roughness of the BPSG film. This results in loss of contact area between the BPSG film and the metal film. Therefore, the finer the semiconductor device is fabricated by increasing the concentration of boron and/or phosphorous, the more likely that metal burring of the process-monitor electrode pad occurs in the dicing process. As a result, dicing of semiconductor wafers becomes more difficult.

One example for preventing such a problem is disclosed in Japanese Laid-Open Patent Application No. 2005-191334. Japanese Laid-Open Patent Application No. 2005-191334 discloses a process-monitor electrode pad disposed inside a semiconductor chip so that only the semiconductor device for process monitoring is disposed on the scribe line. Accordingly, the electrode pad would not obstruct the dicing process.

However, since the method disposes a process-monitor electrode pad inside a semiconductor chip, the semiconductor chip is to be formed in a large size. This increases manufacturing cost. This additional electrode pad disposed inside the semiconductor chip is a critical problem particularly for a semiconductor chip product having a large number of electrode pads, since the chip size of the product is decided according to the limits in the distance between electrode pads.

As shown in FIG. 15B, a guard ring formed of a metal material may be disposed between a semiconductor chip and a scribe line for preventing the inside of the semiconductor chip being damaged in the dicing process. However, by disposing the process-monitor electrode pad inside the semiconductor chip, the process-monitor electrode pad is required to overstep the guard ring for contacting with a process-monitor semiconductor device. This is a difficult task to accomplish since a portion of the guard ring, being formed of metal material, would undesirably be cut off for accomplishing such task. If such portion of the guard ring is cut off, the purpose of providing the guard ring would be lost.

Japanese Laid-Open Patent Application No. 2005-191334 also discloses an example of disposing a process-monitor electrode pad inside a semiconductor chip and using the process-monitor electrode pad not only for process-monitoring but also as an electrode pad of the semiconductor chip.

However, since there is, in general, no correlation between the number of semiconductor devices provided on the scribe line for process-monitoring and the number of electrode pads used in each product, it is difficult to adjust the position of semiconductor devices disposed on the scribe line and the position of the electrode pads used for a product. Furthermore, this example requires a separate probe card for each product when performing electric measuring with a process monitoring device. In addition, this example does not resolve the above-described problem of the guard ring.

Japanese Laid-Open Patent Application No. 2005-191334 also discloses an example of disposing process-monitor electrode pads and semiconductor devices within the scribe line but not in the dicing area (cutting area) of the scribe line.

However, this example requires the scribe line to be wide. This reduces the number of semiconductor chips that can be cut off (diced) from a semiconductor wafer. As a result, manufacturing cost is increased.

SUMMARY

In an aspect of this disclosure, there is provided a semiconductor wafer having a scribe line dividing the semiconductor wafer into a matrix of a plurality of semiconductor chips, the semiconductor wafer including a polysilicon layer, a poly-metal interlayer insulation film formed on the polysilicon layer, and a first metal wiring layer formed on the poly-metal interlayer insulation film, the semiconductor wafer characterized by including: a process-monitor electrode pad formed on a dicing area of the scribe line, the process-monitor electrode pad having a width greater than the width of the dicing area, the process-monitor electrode pad including a contact hole formed in the poly-metal insulation film for connecting the first metal wiring layer to the polysilicon layer.

In the semiconductor wafer according to an exemplary embodiment, the contact hole is not formed in the dicing area.

In the semiconductor wafer according to an exemplary embodiment, the semiconductor wafer may further include a second wiring layer formed on the first wiring layer, wherein the first wiring layer is not formed in the dicing area.

In the semiconductor wafer according to an exemplary embodiment, the poly-metal interlayer insulation film may be a BPSG film.

In another aspect of this disclosure, there is provided a semiconductor wafer having a scribe line dividing the semiconductor wafer into a matrix of a plurality of semiconductor chips, the semiconductor wafer having a multi-layer metal wiring configuration including at least three metal wiring layers, the semiconductor wafer characterized by including: a process-monitor electrode pad formed on a dicing area of the scribe line, the process-monitor electrode pad having a width greater than the width of the dicing area, the process-monitor electrode pad including at least one of the metal wiring layers of the multi-layer metal wiring configuration; wherein the lowermost metal wiring layer of the multi-layer metal wiring configuration is not formed in the process-monitor electrode pad.

In the semiconductor wafer according to an exemplary embodiment, the process-monitor electrode pad may include only the uppermost metal wiring layer of the multi-layer wiring configuration.

In the semiconductor wafer according to an exemplary embodiment, the process-monitor electrode pad may include the uppermost metal wiring layer of the multi-layer metal wiring configuration and a metal wiring layer formed beneath the uppermost metal wiring layer.

In the semiconductor wafer according to an exemplary embodiment, none of the metal wiring layers of the multi-layer metal wiring configuration may be formed below the metal wiring layer of the process-monitor electrode pad in the dicing area of the scribe line.

In the semiconductor wafer according to an exemplary embodiment, the multi-layer metal wiring configuration may include a BPSG film, wherein the lowermost metal wiring layer of the multi-layer metal wiring configuration is formed on the BPSG film.

BRIEF DESCRIPTION OF DRAWINGS

FIG. 19A is a plan view showing a portion of a process-monitoring area in a scribe line according to another embodiment of the present invention;

FIG. 19B is a cross-sectional view taken along line C-C of FIG. 19A;

BEST MODE FOR CARRYING OUT THE INVENTION

Figure 1A:
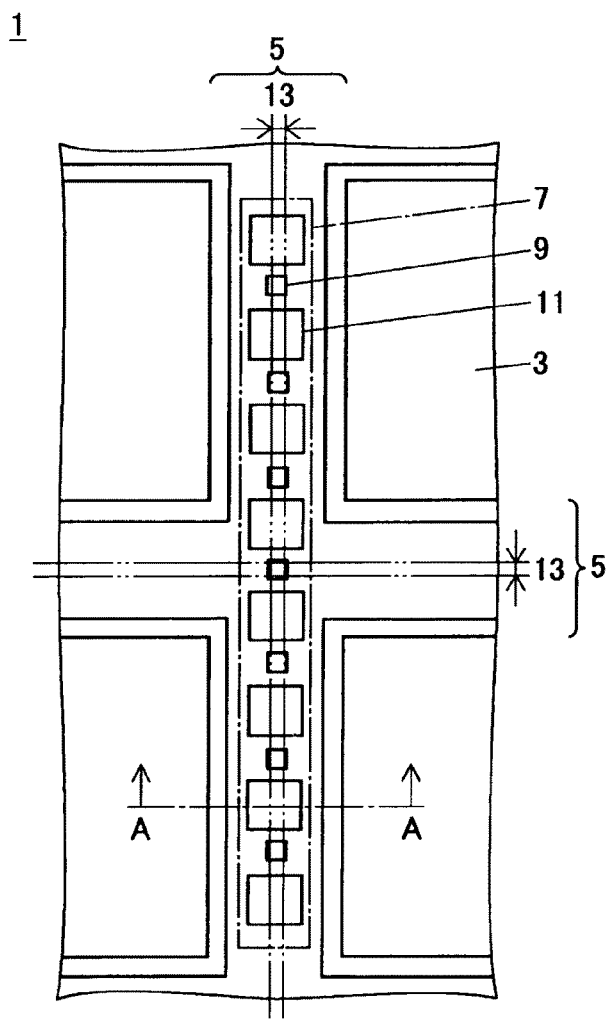
FIG. 1A is a plan view showing the vicinity of a scribe line of a semiconductor wafer according to a first embodiment of the present invention.

The present invention is described in detail based on the embodiments illustrated in the drawings.

First Embodiment

Figure 1B:
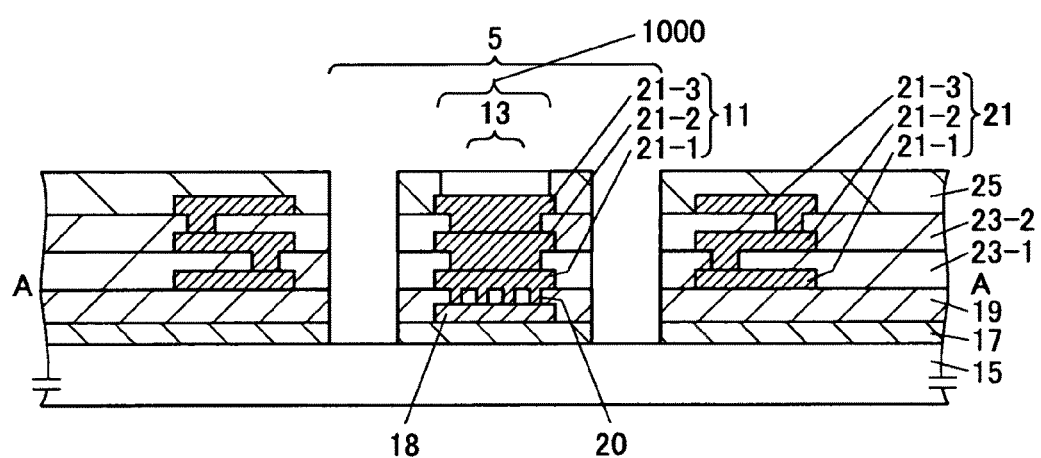
FIG. 1B is a cross-sectional view taken along line A-A of FIG. 1A.
Figure 2:
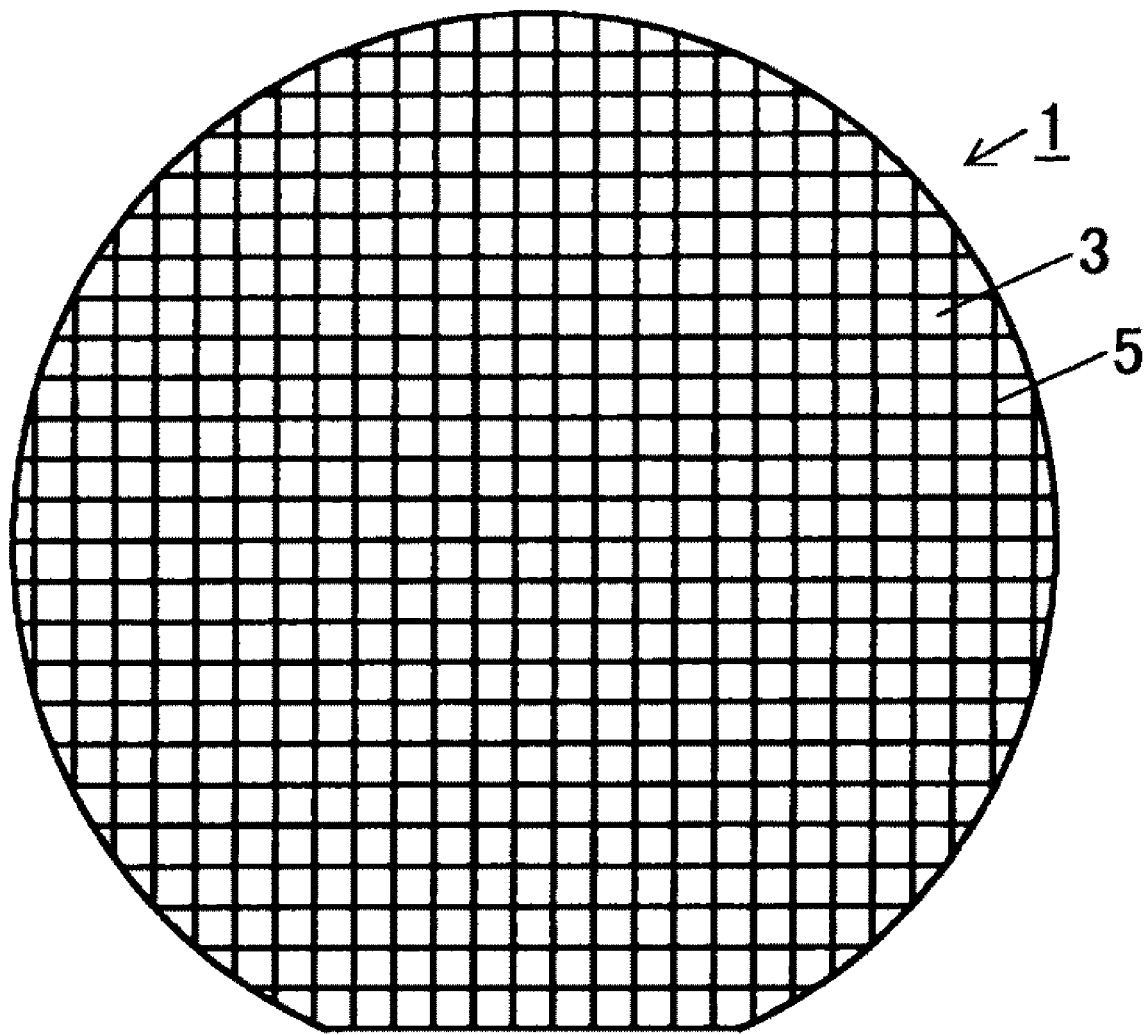
FIG. 2 is a plan view showing an overall configuration of a semiconductor wafer according to an embodiment of the present invention.
Figure 3A:
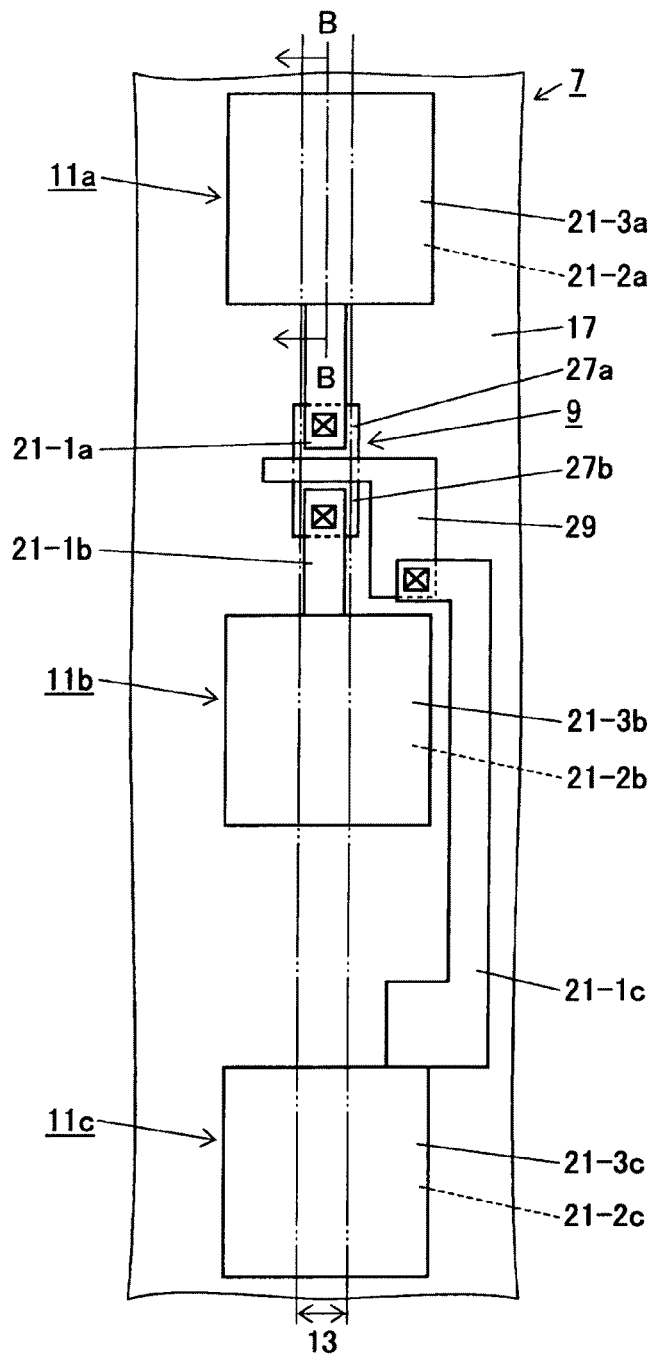
FIG. 3A is a plan view showing a portion of a process-monitoring area in a scribe line according to an embodiment of the present invention.
Figure 3B:
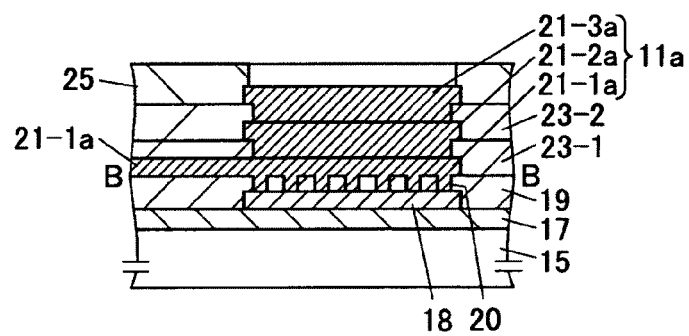
FIG. 3B is a cross-sectional view taken along line B-B of FIG. 3A.

FIGS. 1A and 1B are schematic diagrams for describing a semiconductor wafer 1 according to an embodiment of the present invention. More specifically, FIG. 1A is a plan view showing the vicinity of a scribe line of the semiconductor wafer 1, and FIG. 1B is a cross-sectional view taken along line A-A of FIG. 1A. FIG. 2 is a plan view showing an overall configuration of the semiconductor wafer 1 according to an embodiment of the present invention. FIGS. 3A and 3B are schematic diagrams for describing a portion of a process monitoring device disposed on a scribe line according to an embodiment of the present invention. More specifically, FIG. 3A is a plan view showing the portion of the process monitoring device, and FIG. 3B is a cross-sectional view taken along line B-B of FIG. 3A. The semiconductor wafer 1 according to an embodiment of the present invention has a three metal layer wiring configuration.

As shown in FIG. 2, the semiconductor wafer 1 has plural semiconductor chips 3 that are divided and arranged in a matrix form by scribe lines 5. The width of the scribe line 5 in this example is 100 μm. As shown in FIG. 1A, the scribe line 5 has a process-monitoring area 7, on which plural semiconductor devices used for process monitoring (hereinafter referred to as "process-monitor semiconductor devices") 9 and plural electrode pads used for process monitoring (hereinafter referred to as "process-monitor electrode pads") 11 are arranged. The plane size of the process-monitor electrode pad 11 is, for example, 70 μm×70 μm. The center area of the scribe line 5 is the area that is diced (cut) in the dicing process (hereinafter referred to as "dicing area 13"). The width of the dicing area 13 is substantially equal to the thickness of the blade used for dicing the semiconductor wafer 1. For example, in a case where a blade having a thickness ranging from 20-40 μm is used, the width of the dicing area is 20-40 μm.

Next, the cross-sectional configuration of the semiconductor wafer 1 is described with reference to FIG. 1B. In this example, a LOCOS oxide film 17 is formed on a semiconductor substrate 15 formed of a silicon material. A polysilicon layer 18 is formed on the LOCOS oxide film 17 in an area where the process-monitor electrode pad 11 is to be formed (hereinafter referred to as "process-monitor electrode pad forming area") 1000. A BPSG film 19 (i.e. poly-metal interlayer film) is formed on the LOCOS oxide film 17 including the area where the polysilicon layer 18 is formed.

Plural contact holes 20 are formed in the BPSG film 19 in the process-monitor electrode pad forming area 1000. In this example, 2500 contact holes 20 (50 holes in the longitudinal direction×50 holes in the lateral direction) are formed in the BPSG film 19 in the process-monitor electrode pad forming area 1000. The contact holes 20 illustrated in FIG. 1B are abbreviated for the sake of convenience. In this example, each contact hole 20 has a plane area of 0.4 μm×0.4 μm. It is however to be noted that the number, the arrangement, and the size of the contact holes 20 are not to be limited to those described in this example.

In the process-monitor electrode pad forming area 1000, a first metal wiring layer 21-1 is formed on the BPSG film 19 and in the contact holes 20 of the BPSG film 19. In addition, in the area illustrated in the drawing, the first metal wiring layer 21-1 is formed in an annular shape along the peripheral part of the semiconductor chip 3. The first metal wiring layer 21-1 may also be formed on other areas (not shown in FIG. 1B) of the semiconductor wafer 1. The first metal wiring layer 21-1 includes a high melting point metal film (e.g. titanium film) having an aluminum alloy film (e.g. AlSiCu film) formed thereon.

A first interlayer insulation film 23-1 is formed on the BPSG film 19 including the area on which the first metal wiring layer 21-1 is formed. The first interlayer insulation film 23-1 has a layered configuration including, for example, a NSG (Non-doped Silicate Glass) film, an SOG (Spin On Glass) film, and an NSG film. In the process-monitor electrode pad forming area 1000, a through-hole is formed in the first interlayer insulation film 23-1 on the first metal wiring layer 21-1. An annular through-hole is also formed in the first interlayer insulation film 23-1 on the first metal wiring layer 21-1 along the peripheral part of the semiconductor chip 3.

In the process-monitor electrode pad forming area 1000, a second metal wiring layer 21-2 is formed on the first interlayer insulation film 23-1 and in the through-hole of the first interlayer insulation film 23-1. In addition, in the area illustrated in the drawing, the second metal wiring layer 21-2 is formed in an annular shape along the peripheral part of the semiconductor chip 3. The second metal wiring layer 21-2 may also be formed on other areas (not shown in FIG. 1B) of the semiconductor wafer 1. The second metal wiring layer 21-1 may also be formed of, for example, a titanium film having an AlSiCu film formed thereon.

A second interlayer insulation film 23-2 is formed on the first interlayer insulation film 23-1 including the area on which the second metal wiring layer 21-2 is formed. The second interlayer insulation film 23-2 also has a layered configuration including, for example, a NSG film, an SOG film, and an NSG film. In the process-monitor electrode pad forming area 1000, a through-hole is formed in the second interlayer insulation film 23-2 on the second metal wiring layer 21-2. An annular through-hole is also formed in the second interlayer insulation film 23-2 on the second metal wiring layer 21-2 along the peripheral part of the semiconductor chip 3.

In the process-monitor electrode pad forming area 1000, a third metal wiring layer 21-3 is formed on the second interlayer insulation film 23-2 and in the through-hole of the second interlayer insulation film 23-2. In addition, in the area illustrated in the drawing, the third metal wiring layer 21-3 is formed in an annular shape along the peripheral part of the semiconductor chip 3. The third metal wiring layer 21-3 may also be formed on other areas (not shown in FIG. 1B) of the semiconductor wafer 1. The third metal wiring layer 21-3 may also be formed of, for example, a titanium film having an AlSiCu film formed thereon.

A final protective film 25 is formed on the second interlayer insulation film 23-2 including the area on which the third metal wiring layer 21-3 is formed. The final protective film 25 has a layered configuration including, for example, a silicon oxide film and a silicon nitride film. In the process-monitor electrode pad forming area 1000, a pad opening part is formed in the final protective film 25. Thereby, the surface of the third metal wiring layer 21-3 is exposed.

The layered configuration including the first, second, and third metal wiring layers 21-1, 21-2, 21-3 formed along the peripheral part of the semiconductor chip 3 is a guard ring 21 serving to guard the inside of the semiconductor chip 3.

The LOCOS oxide film 17, the BPSG film 19, the first interlayer insulation film 23-1, the second interlayer insulation film 23-2, and the final protective film 25 have both of their end parts (in the width direction of the scribe line 5) removed in a belt-like manner. In this example, the width of the removed end part is 10 μm. By removing both end parts of the LOCOS oxide film 17, the BPSG film 19, the first interlayer insulation film 23-1, the second interlayer insulation film 23-2, and the final protective film 25 in the width direction of the scribe line 5, cracks which may be formed in the insulation films during the dicing of the dicing area 13 can be prevented from reaching the semiconductor chips 3. It is however to be noted that the semiconductor wafer 1 of the present invention is not limited to a configuration having both end parts removed in the width direction of the scribe line 5.

Next, the process monitoring area 7 is described with reference to FIGS. 3A and 3B. In FIG. 3B, illustration of the BPSG film 19, the first interlayer insulation film 23-1, the second interlayer insulation film 23-2, and the final protective film 25 included in the semiconductor chip 3 is omitted.

In FIG. 3A, two active regions 27a, 27b are formed as the source and drain on the surface of a semiconductor substrate area surrounded by the LOCOS oxide film 17. A gate electrode 29 made of polysilicon is formed on the semiconductor substrate in the area between the two active regions 27a, 27b via a gate insulation film. The two active regions 27a, 27b, and the gate electrode 29 together form a transistor (i.e. process-monitor semiconductor device 9). The transistor is situated in a part of the dicing area that is different from the part where the process-monitor electrode pad 11 is situated. In the example shown in FIG. 3A, the transistor is situated between a process-monitor electrode pad 11a and a process-monitor electrode pad 11b. Both ends of the polysilicon gate electrode 29 are formed in a manner extending across the LOCOS oxide film 17.

First metal wiring layers 21-1a, 21-1b, and 21-1c of the process-monitor electrode pads 11a, 11b, and 11c are formed in continuation on the BPSG film 19. The first metal wiring layers 21-1a, 21-1b, and 21-1c have a width ranging from 2 μm to 3 μm. Although parts of the first metal wiring layers 21-1a and 21-1b extending from the process-monitor electrode pads 11a and 11b are situated in the dicing area 13 (as shown in FIG. 3A), the position of the first metal wiring layers 21-1a, 21-1b is not limited to the position shown in FIG. 3A.

One end of the first metal wiring layer 21-1a, which is situated above the active region 27a, is electrically connected to the active region 27a via the contact holes 20 formed in the BPSG film 19. The other end of the first metal wiring layer 21-1a is connected to the process-monitor electrode pad 11a (first metal wiring layer 21-1a of the process-monitor electrode pad 11a).

One end of the first metal wiring layer 21-1b, which is situated above the active region 27b, is electrically connected to the active region 27b via the contact holes 20 formed in the BPSG film 19. The other end of the first metal wiring layer 21-1b is connected to the process-monitor electrode pad 11b (first metal wiring layer 21-1b of the process-monitor electrode pad 11b).

One end of the first metal wiring layer 21-1c, which is situated above the gate electrode 29, is electrically connected to the gate electrode 29 via the contact holes 20 formed in the BPSG film 19. The other end of the first metal wiring layer 21-1c is connected to the process-monitor electrode pad 11c (first metal wiring layer 21-1c of the process-monitor electrode pad 11c).

In the process-monitor electrode pad forming area 1000 corresponding to the process-monitor electrode pads 11a, 11b, and 11c, second metal wiring layers 21-2a, 21-2b, and 21-2c are formed on the first interlayer insulation film 23-1, and third metal wiring layers 21-3a, 21-3b, and 21-3c are formed on the second interlayer insulation film 23-2.

Since contact holes 20 for connecting the first metal wiring layer 21-1 (21-1a, 21-1b, 21-1c) and the polysilicon layer 18 are formed in the BPSG film 19 below the process-monitor electrode pad 11 (11a, 11b, 11c), the area in which the upper surface of the BPSG film 19 and the first metal wiring layer 21 (21-1a, 21-1b, 21-1c) make contact can be reduced. Furthermore, the first metal wiring layer 21 (21-1a, 21-1b, 21-1c) can be prevented from peeling even where the process-monitor electrode pad 11 (11a, 11b, 11c) is situated in the dicing area 13 of the scribe line 5. Thereby, metal burring can be prevented. It is however to be noted that the semiconductor wafer 1 of the present invention is not limited to a configuration having a bottommost metal wiring layer formed on a BPSG film.

Furthermore, since the process-monitor electrode pad 11 is arranged in a manner including the dicing area of the scribe line 5, there is no need to increase the size of the semiconductor chip 3 or the width of the scribe line 5.

Since plural contact holes 20 are formed in the BPSG film 19 below the process-monitor electrode pad 11, the BPSG film 19 and the first metal wiring layer 21-1 can make contact via the inner walls of the contact holes 20. Thereby, peeling of the first metal wiring layer 21-1 can be prevented.

Furthermore, compared to a process-monitor electrode pad having only a single metal wiring layer formed on an uppermost layer, the process-monitor electrode pad 11 is more likely to prevent the problem of a probe piercing through the process-monitor electrode pad when testing (monitoring) the semiconductor wafer. This is due to the process-monitor electrode pad 11 being formed of three metal wiring layers 21-1, 21-2, 21-3.

Figure 4A:
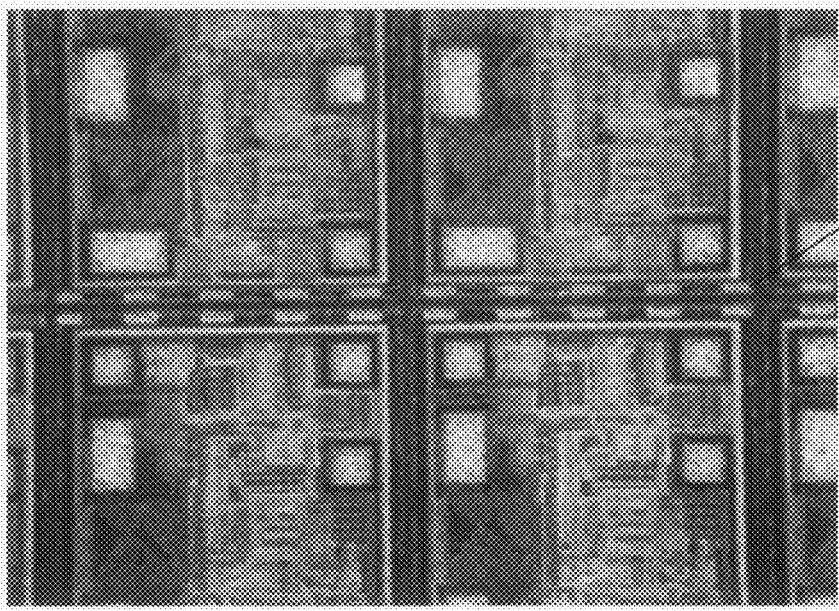
FIG. 4A is a photomicrograph of a semiconductor wafer having a polysilicon layer and contact holes formed below a process-monitor electrode pad according to an embodiment of the present invention.
Figure 4B:
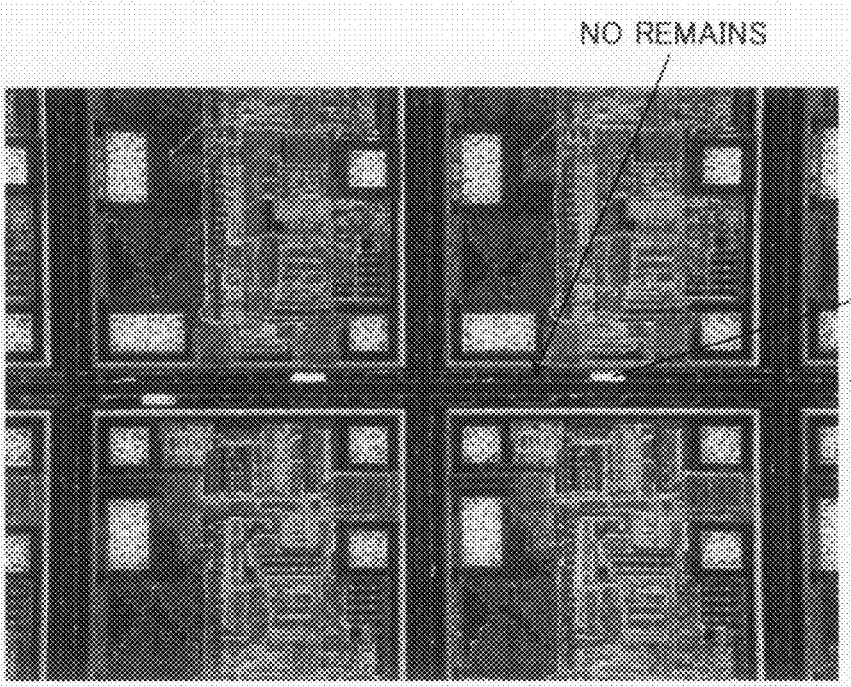
FIG. 4B is a photomicrograph of a conventional semiconductor wafer.

FIGS. 4A and 4B are photomicrographs taken after dicing the dicing area of a semiconductor wafer. FIG. 4A is a photomicrograph of a semiconductor wafer having a polysilicon layer and contact holes formed below a process-monitor electrode pad according to an embodiment of the present invention. FIG. 4B is a photomicrograph of a conventional semiconductor wafer.

FIG. 4A shows that none of the process-monitor electrode pads 11 on the semiconductor wafer 1 of the present invention are peeled off. Meanwhile, FIG. 4B shows that 90% or more of the process-monitor electrode pads 11 are peeled off with very few process-monitor electrode pads 11 left remaining on the semiconductor wafer.

Accordingly, the present invention can reduce the probability of creating metal burrs in the process-monitor electrode pad.

Figure 5A:
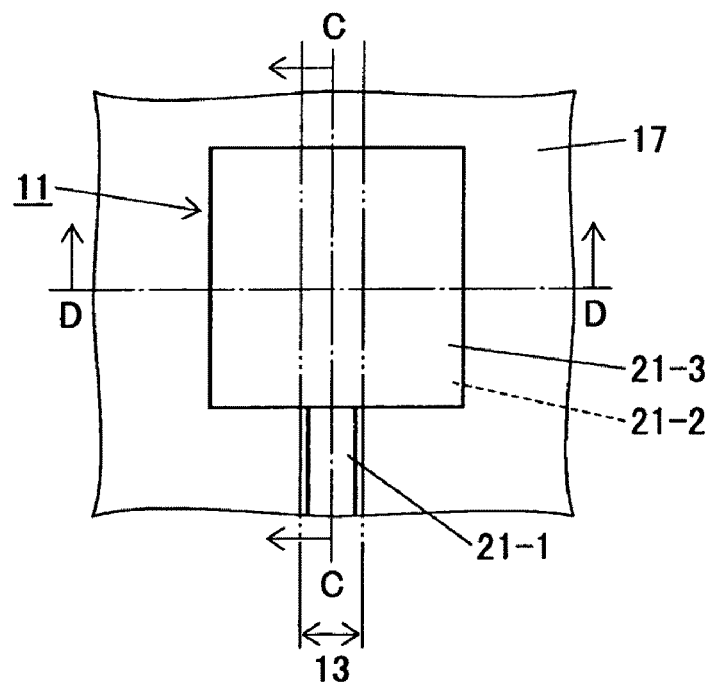
FIG. 5A is a plan view showing the vicinity of a scribe line of a semiconductor wafer according to another embodiment of the present invention.
Figure 5B:
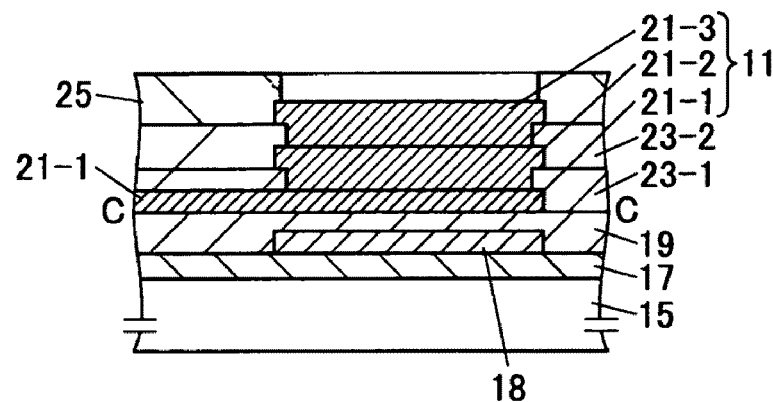
FIG. 5B is a cross-sectional view taken along line C-C of FIG. 5A.
Figure 5C:
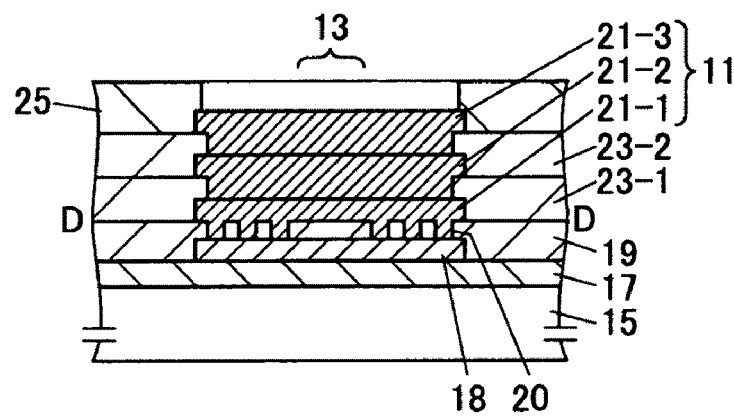
FIG. 5C is a cross-sectional view taken along line D-D of FIG. 5A.

Although contact holes 20 are formed in the dicing area 13 in the above-described embodiment of the present invention, the contact holes 20 may alternatively be formed in an area outside of the dicing area 13 (See FIGS. 5A-5C). Since the first metal wiring layer 21-1 is connected to the polysilicon layer 18 via the contact holes 20 formed in an area besides the dicing area 13 (hereinafter referred to as "different area"), no peeling of the first metal wiring layer 21-1 in the different area can be found after the dicing process. Furthermore, since the first metal wiring layer 21-1 in the dicing area 13 is completely crushed, no peeling of the first metal wiring layer 21-1 in the dicing area can be found. Moreover, the stress in the vicinity of the process-monitor electrode pad 11 caused by the first metal wiring layer 21-1 formed in the contact holes 20 can be reduced. Thereby, the creation of metal burrs can be further reduced.

Figure 6A:
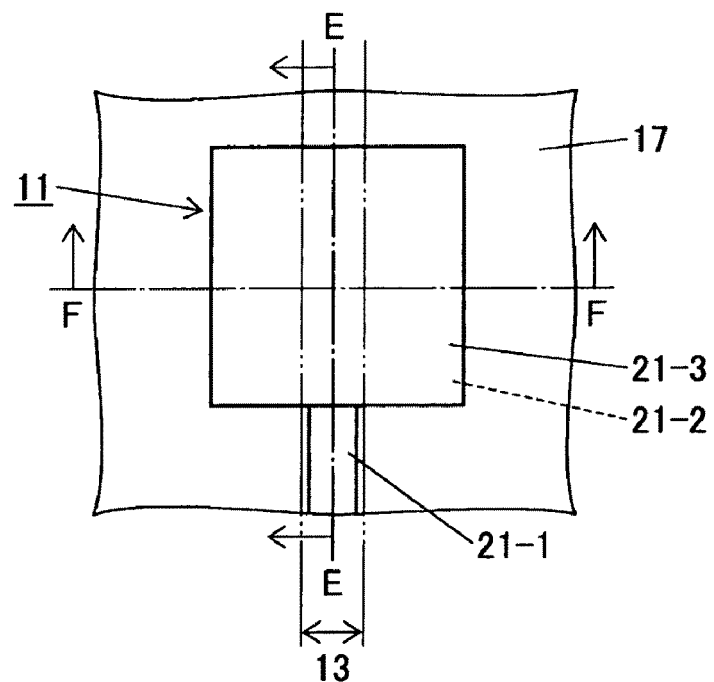
FIG. 6A is a plan view showing the vicinity of a scribe line of a semiconductor wafer according to another embodiment of the present invention.
Figure 6B:
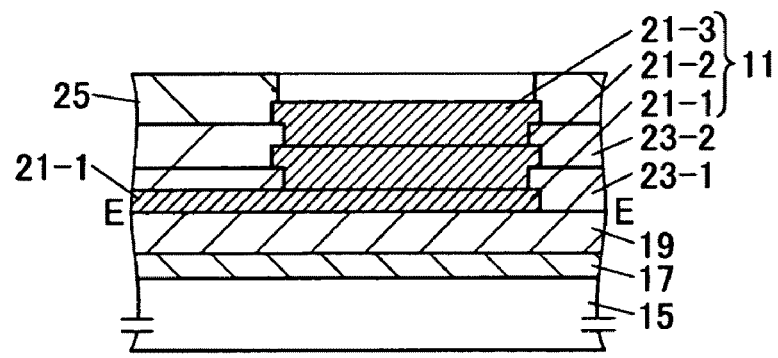
FIG. 6B is a cross-sectional view taken along line E-E of FIG. 6A.
Figure 6C:
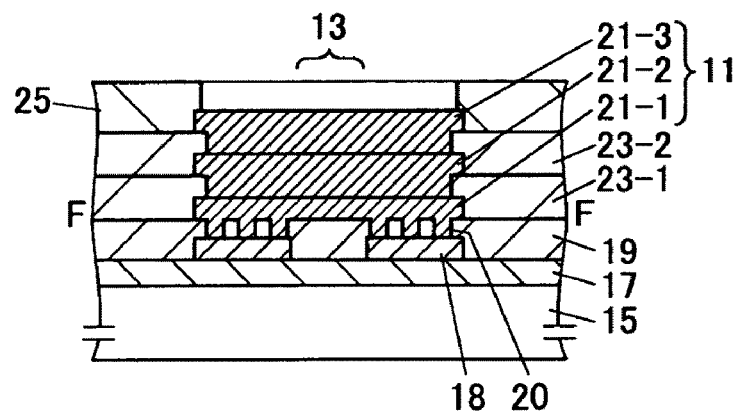
FIG. 6C is a cross-sectional view taken along line F-F of FIG. 6A.

In addition to forming the contact holes 20 in an area outside of the dicing area 13 (different area), the polysilicon layer 18 may also be formed in the different area (See FIGS. 6A-6C). Since the first metal wiring layer 21-1 is connected to the polysilicon layer 18 via the contact holes 20 formed in the different area, no peeling of the first metal wiring layer 21-1 in the different area can be found after the dicing process. Furthermore, since the first metal wiring layer 21-1 in the dicing area 13 is completely crushed, no peeling of the first metal wiring layer 21-1 in the dicing area can be found. Moreover, the stress in the vicinity of the process-monitor electrode pad 11 caused by the polysilicon layer 18 during dicing can be reduced. Thereby, the creation of metal burrs can be further reduced.

Figure 7A:
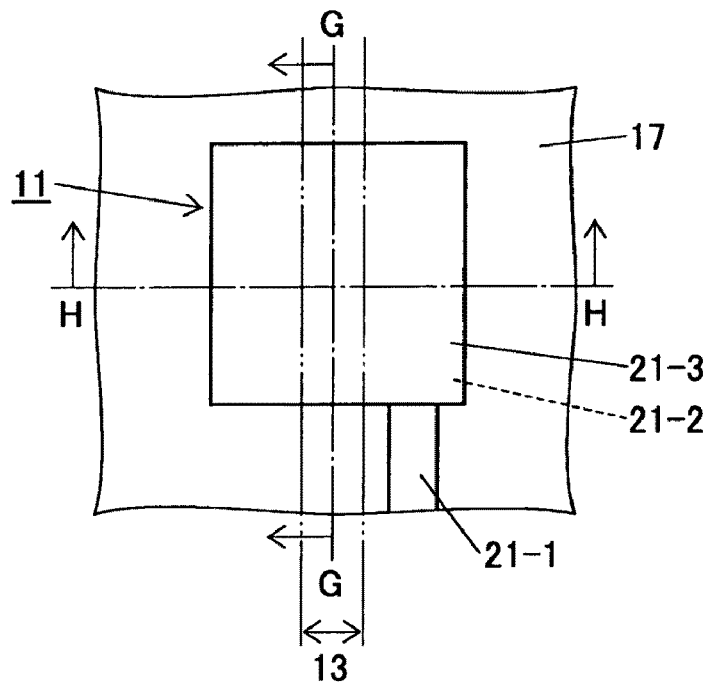
FIG. 7A is a plan view showing the vicinity of a scribe line of a semiconductor wafer according to another embodiment of the present invention.
Figure 7B:
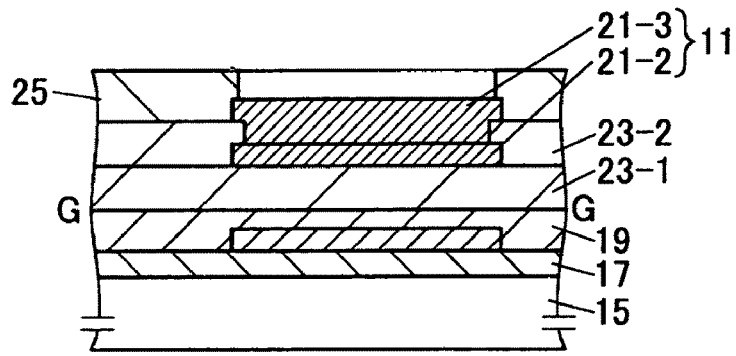
FIG. 7B is a cross-sectional view taken along line G-G of FIG. 7A.
Figure 7C:
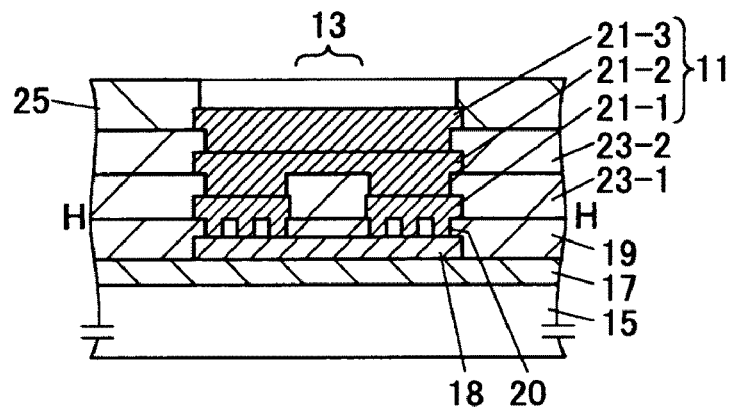
FIG. 7C is a cross-sectional view taken along line H-H of FIG. 7A.

In addition to forming the contact holes 20 in an area outside of the dicing area 13 (different area), the first metal wiring layer 21-1 may also be formed in the different area (See FIGS. 7A-7C). Compared to a case where the first metal wiring layer 21-1 is formed in the dicing area 13, the stress in the vicinity of the process-monitor electrode pad 11 caused by the first metal wiring layer 21-1 during dicing can be reduced. Thereby, the creation of metal burrs can be further reduced.

Furthermore, as described above, there is a weak adhesion between the BPSG film and the titanium film (metal substrate). For example, the creation of metal burrs can be reduced in a case where a combination of the poly-metal interlayer insulation film and the first metal wiring layer having a weak adhesion is used. That is, the creation of metal burrs can be reduced in a case where the poly-metal interlayer insulation film includes the BPSG film 19 and the first metal wiring layer 21-1 includes a substrate of titanium film.

Figure 8A:
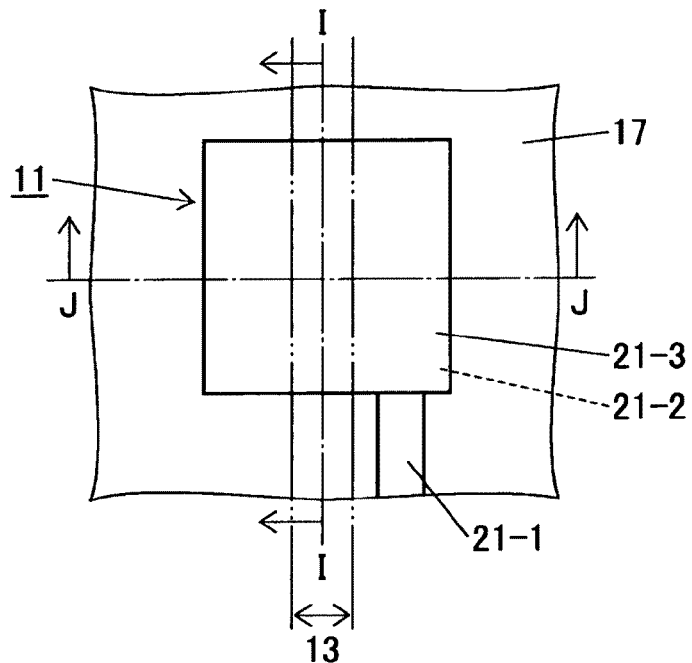
FIG. 8A is a plan view showing the vicinity of a scribe line of a semiconductor wafer according to another embodiment of the present invention.
Figure 8B:
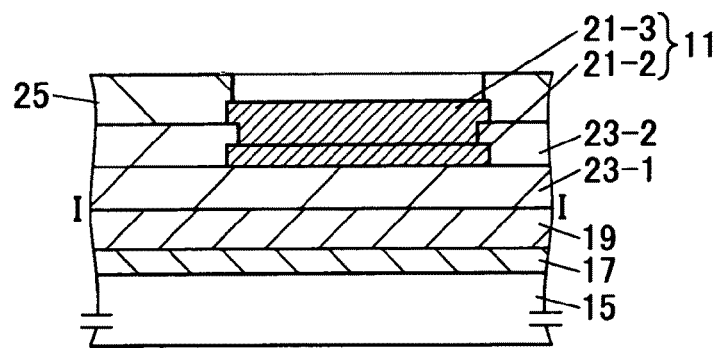
FIG. 8B is a cross-sectional view taken along line I-I of FIG. 8A.
Figure 8C:
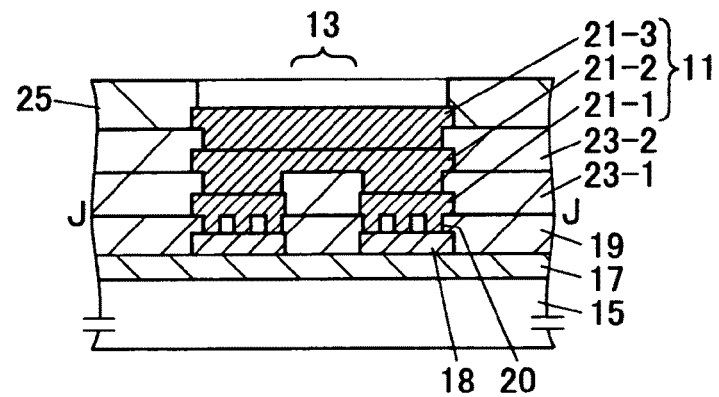
FIG. 8C is a cross-sectional view taken along line J-J of FIG. 8A.

In addition to forming the first metal wiring layer 21-1 in an area outside of the dicing area 13 (different area) as shown in FIGS. 7A-7C, the polysilicon layer 18 may also be formed in the different area (See FIGS. 8A-8C). The stress in the vicinity of the process-monitor electrode pad 11 caused by the polysilicon layer 18 during dicing can be reduced. Thereby, the creation of metal burrs can be further reduced.

Although the above-described embodiment of the present invention is described having plural contact holes 20 formed below the process-monitor electrode pad 11, a single contact hole 20 instead of plural contact holes 20 may be formed (See FIGS. 9A-9C).

Figure 9A:
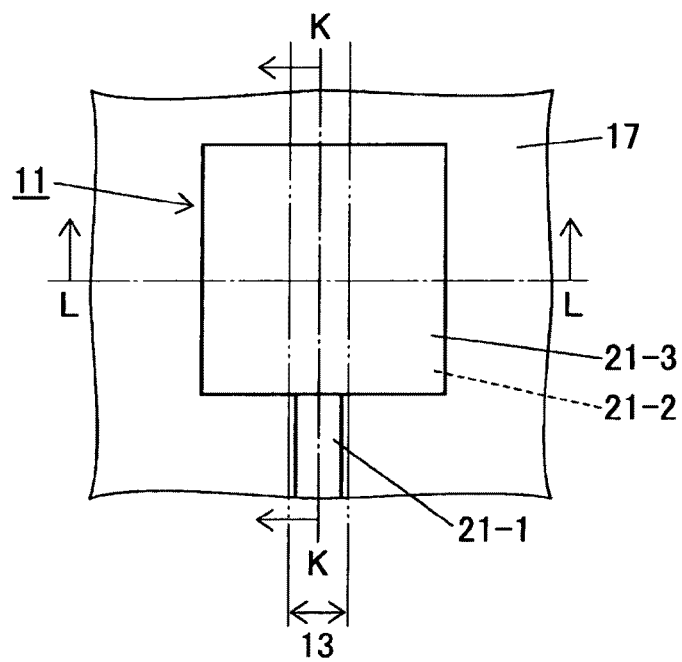
FIG. 9A is a plan view showing the vicinity of a scribe line of a semiconductor wafer according to another embodiment of the present invention.
Figure 9B:
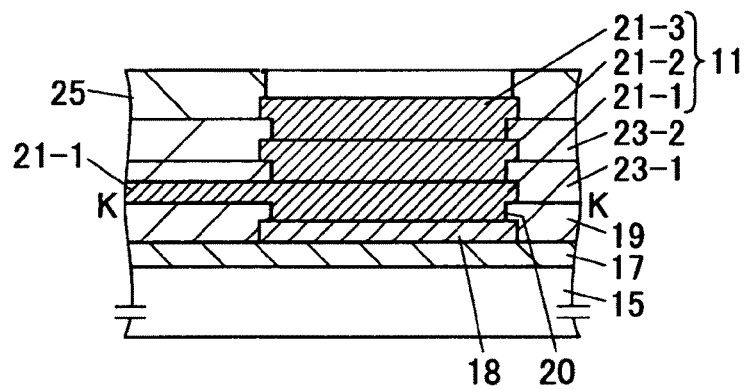
FIG. 9B is a cross-sectional view taken along line K-K of FIG. 9A.
Figure 9C:
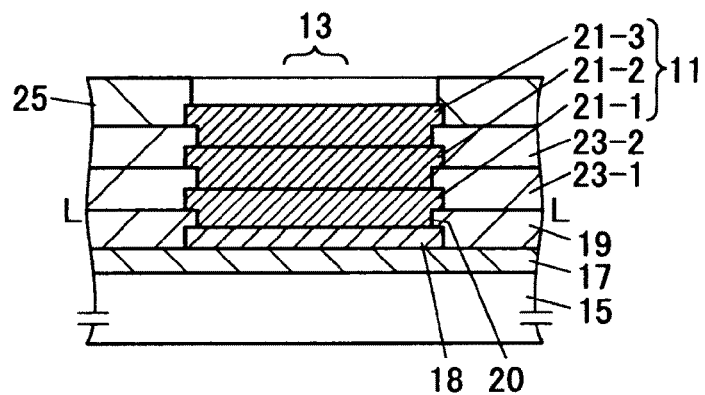
FIG. 9C is a cross-sectional view taken along line L-L of FIG. 9A.

With the exemplary configuration shown in FIGS. 9A-9C, the area in which the first metal wiring layer 21-1 of the process-monitor electrode pad 11 contacts the BPSG film 19 can be reduced. Accordingly, even in a case where the process-monitor electrode pad 11 is situated on the dicing area 13 of the scribe line 5, the first metal wiring layer 21-1 can be prevented from peeling. Thereby, the creation of metal burrs can be reduced.

Furthermore, since the process-monitor electrode pad 11 shown in FIGS. 9A-9C is arranged in the dicing area 13 in the scribe line 5, the size of the semiconductor chip 3 and the width of the scribe line 5 can be reduced.

Furthermore, the exemplary configuration shown in FIGS. 9A-9C can prevent peeling of the first metal wiring layer 21-1 by achieving contact between the BPSG film 19 and the first metal wiring layer 21-1 via the inner wall of the contact hole 20 and placing a large area of the first metal wiring layer 21-1 in contact with the polysilicon layer 18.

Figure 10A:
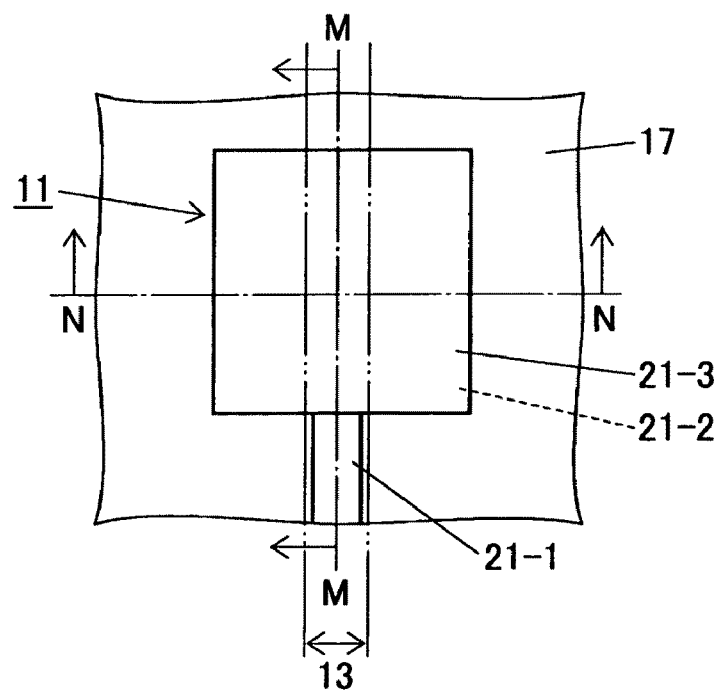
FIG. 10A is a plan view showing the vicinity of a scribe line of a semiconductor wafer according to another embodiment of the present invention.
Figure 10B:
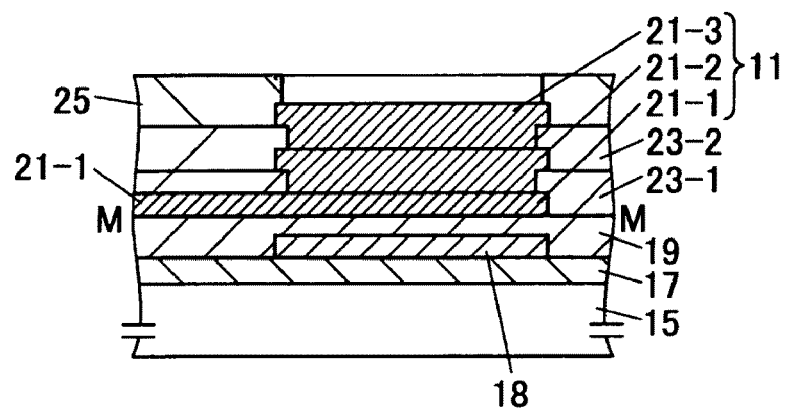
FIG. 10B is a cross-sectional view taken along line M-M of FIG. 10A.
Figure 10C:
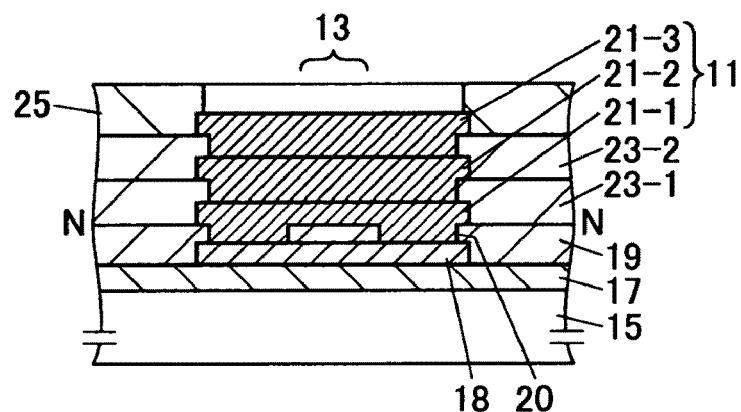
FIG. 10C is a cross-sectional view taken along line N-N of FIG. 10A.

Although the exemplary configuration of FIGS. 9A-9C has the contact hole 20 formed in the dicing area 13, the contact hole(s) 20 may alternatively be formed in an area outside of the dicing area 13 (different area) as shown in FIGS. 10A-10C. Since the first metal wiring layer 21-1 is connected to the polysilicon layer 18 via the contact holes 20 formed in an area besides the dicing area 13 (different area), no peeling of the first metal wiring layer 21-1 in the different area can be found after the dicing process. Furthermore, since the first metal wiring layer 21-1 in the dicing area 13 is completely crushed, no peeling of the first metal wiring layer 21-1 in the dicing area can be found. Moreover, the stress in the vicinity of the process-monitor electrode pad 11 caused by the first metal wiring layer 21-1 formed in the contact holes 20 can be reduced. Thereby, the creation of metal burrs can be further reduced.

Figure 11A:
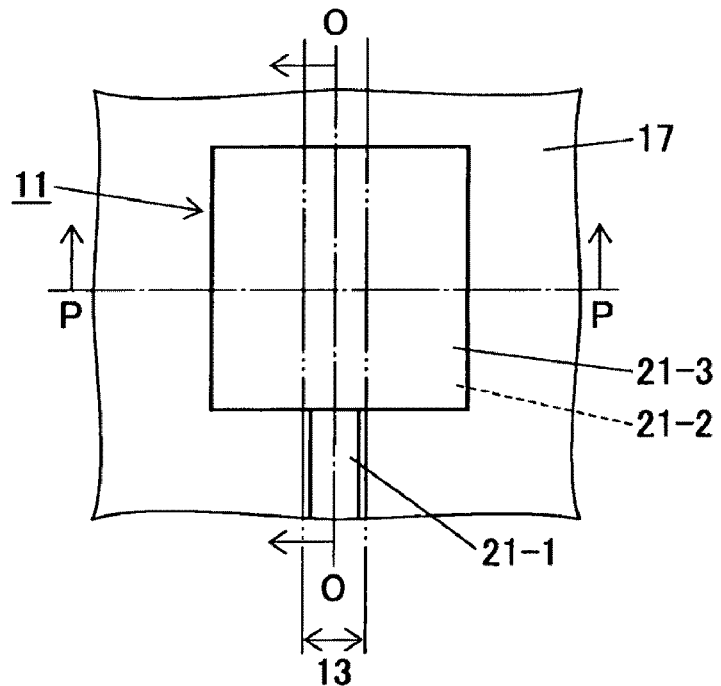
FIG. 11A is a plan view showing the vicinity of a scribe line of a semiconductor wafer according to another embodiment of the present invention.
Figure 11B:
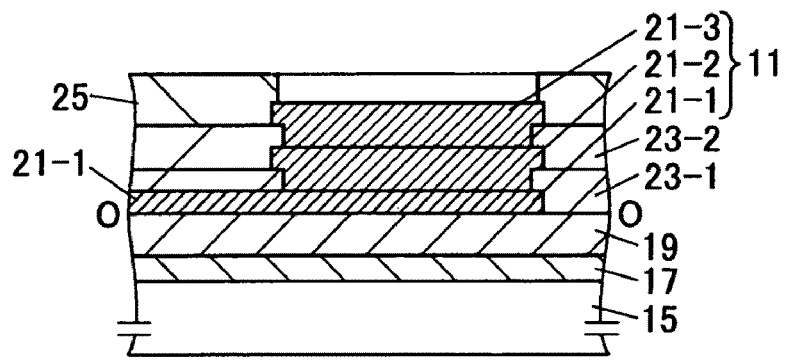
FIG. 11B is a cross-sectional view taken along line O-O of FIG. 11A.
Figure 11C:
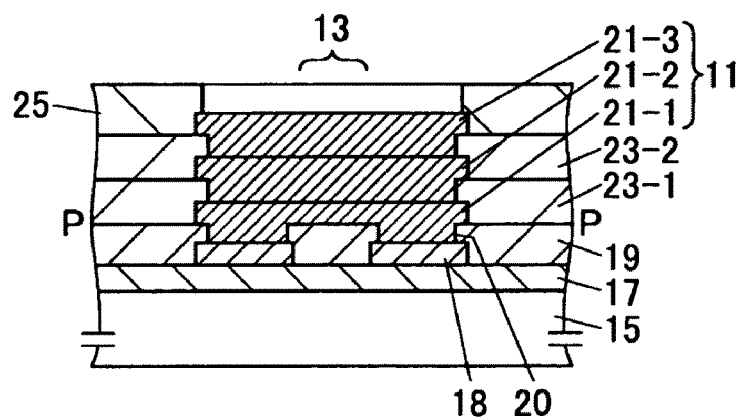
FIG. 11C is a cross-sectional view taken along line P-P of FIG. 11A.

In addition to forming the contact holes 20 in the areas outside of the dicing area 13 (different areas), the polysilicon layer 18 may also be formed in the different areas (See FIGS. 11A-11C). Since the first metal wiring layer 21-1 is connected to the polysilicon layer 18 via the contact holes 20 formed in the different areas, no peeling of the first metal wiring layer 21-1 in the different areas can be found after the dicing process. Furthermore, since the first metal wiring layer 21-1 in the dicing area 13 is completely crushed, no peeling of the first metal wiring layer 21-1 in the dicing area can be found. Moreover, the stress in the vicinity of the process-monitor electrode pad 11 caused by the polysilicon layer 18 during dicing can be reduced. Thereby, the creation of metal burrs can be further reduced.

Figure 12A:
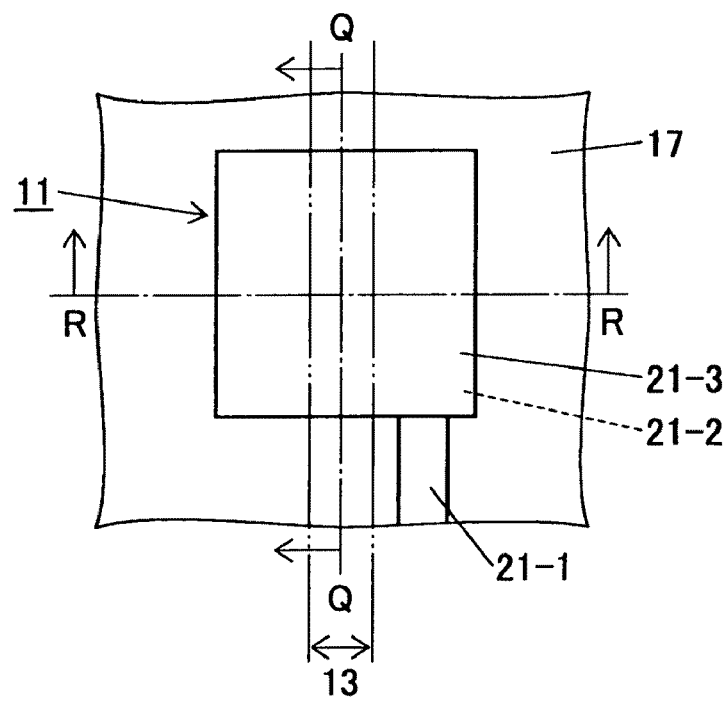
FIG. 12A is a plan view showing the vicinity of a scribe line of a semiconductor wafer according to another embodiment of the present invention.
Figure 12B:
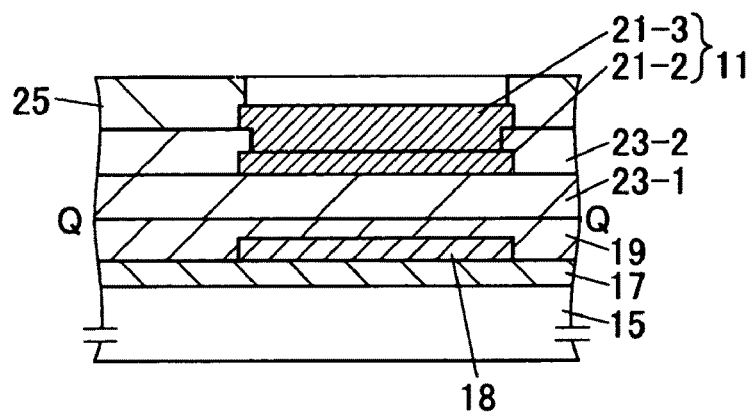
FIG. 12B is a cross-sectional view taken along line Q-Q of FIG. 12A.
Figure 12C:
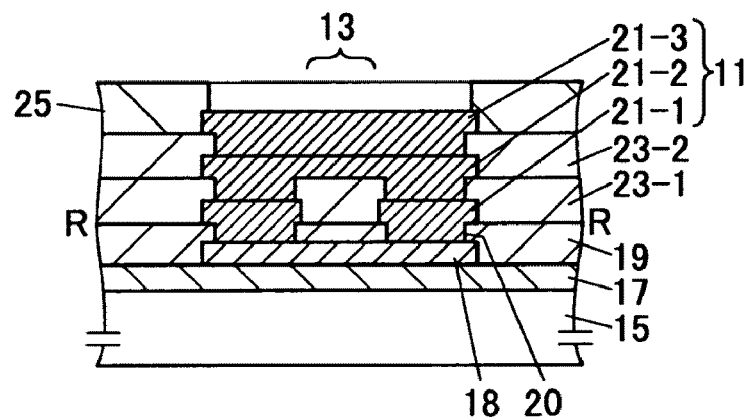
FIG. 12C is a cross-sectional view taken along line R-R of FIG. 12A.

In addition to forming the contact holes 20 in an area outside of the dicing area 13 (different area), the first metal wiring layer 21-1 may also be formed in the different area (See FIGS. 12A-12C). Compared to a case where the first metal wiring layer 21-1 is formed in the dicing area 13, the stress in the vicinity of the process-monitor electrode pad 11 caused by the first metal wiring layer 21-1 during dicing can be reduced. Thereby, the creation of metal burrs can be further reduced.

Furthermore, the creation of metal burrs can be reduced in a case where a combination of the poly-metal interlayer insulation film and the first metal wiring layer having a weak adhesion is used. That is, the creation of metal burrs can be reduced in a case where the poly-metal interlayer insulation film includes the BPSG film 19 and the first metal wiring layer 21-1 includes a substrate of titanium film.

Figure 13A:
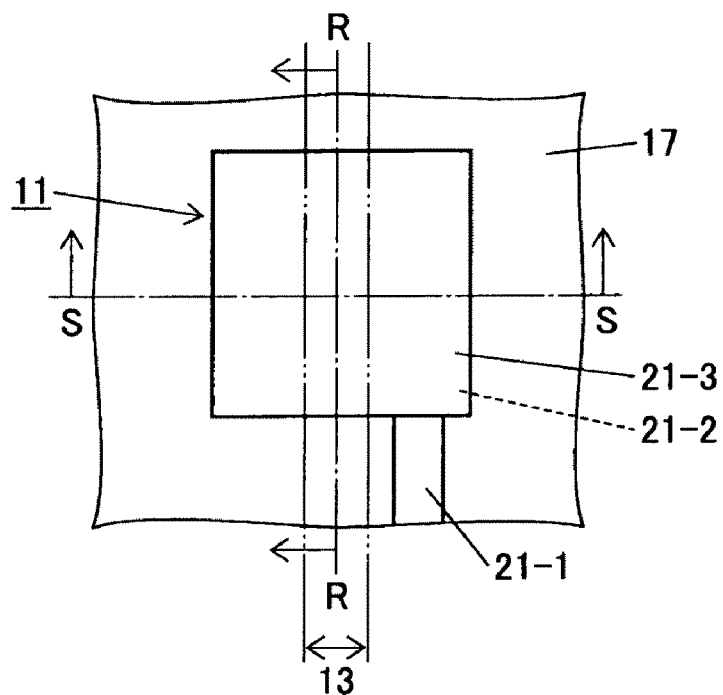
FIG. 13A is a plan view showing the vicinity of a scribe line of a semiconductor wafer according to another embodiment of the present invention.
Figure 13B:
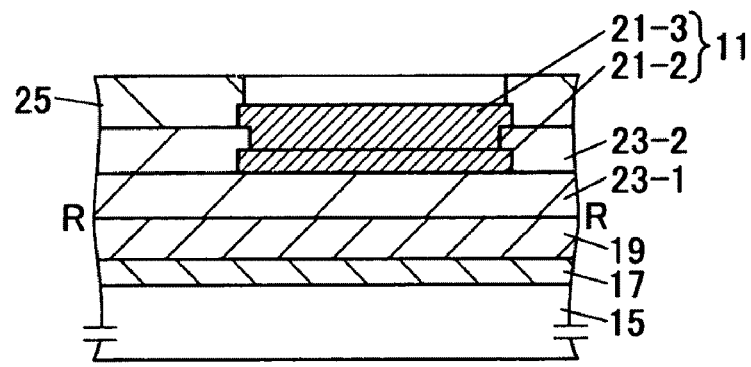
FIG. 13B is a cross-sectional view taken along line R-R of FIG. 13A.
Figure 13C:
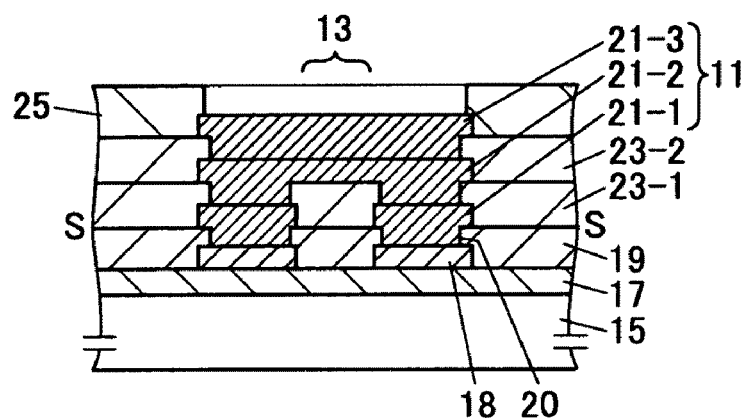
FIG. 13C is a cross-sectional view taken along line S-S of FIG. 13A.

In addition to forming the first metal wiring layer 21-1 in an area outside of the dicing area 13 (different area) as shown in FIGS. 12A-12C, the polysilicon layer 18 may also be formed in the different area (See FIGS. 13A-13C). The stress in the vicinity of the process-monitor electrode pad 11 caused by the polysilicon layer 18 during dicing can be reduced. Thereby, the creation of metal burrs can be further reduced.

Figure 14A:
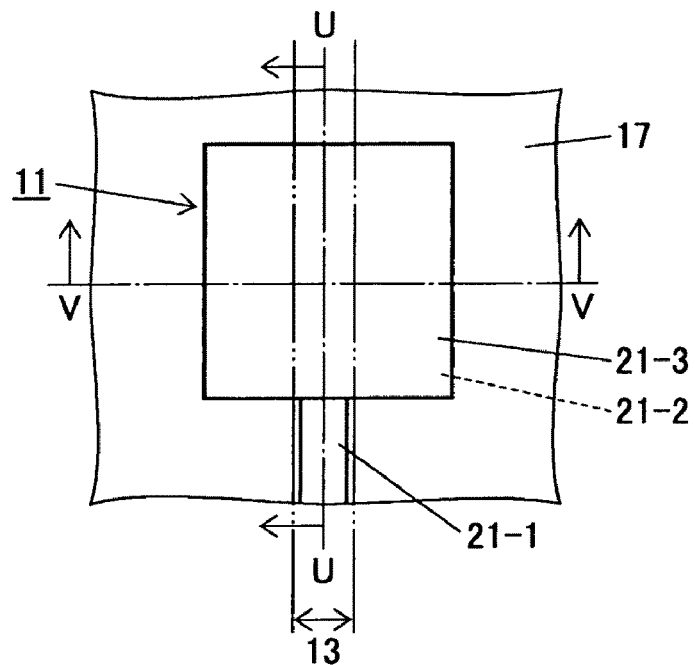
FIG. 14A is a plan view showing the vicinity of a scribe line of a semiconductor wafer according to another embodiment of the present invention.
Figure 14B:
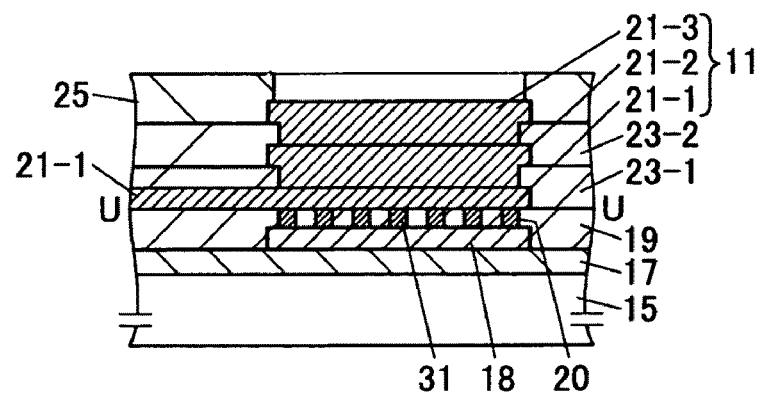
FIG. 14B is a cross-sectional view taken along line U-U of FIG. 14A.
Figure 14C:
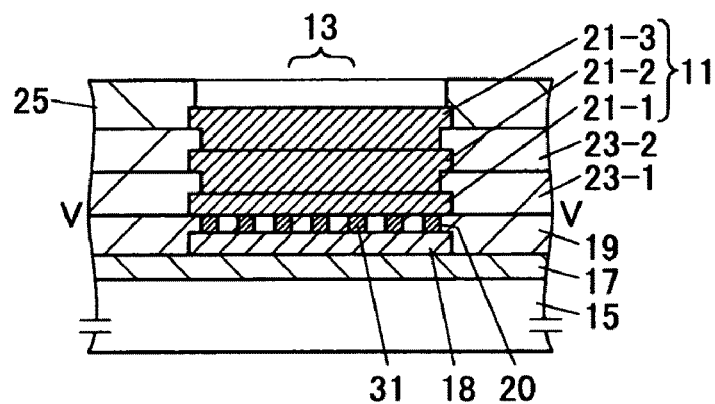
FIG. 14C is a cross-sectional view taken along line V-V of FIG. 14A.
Figure 15A:
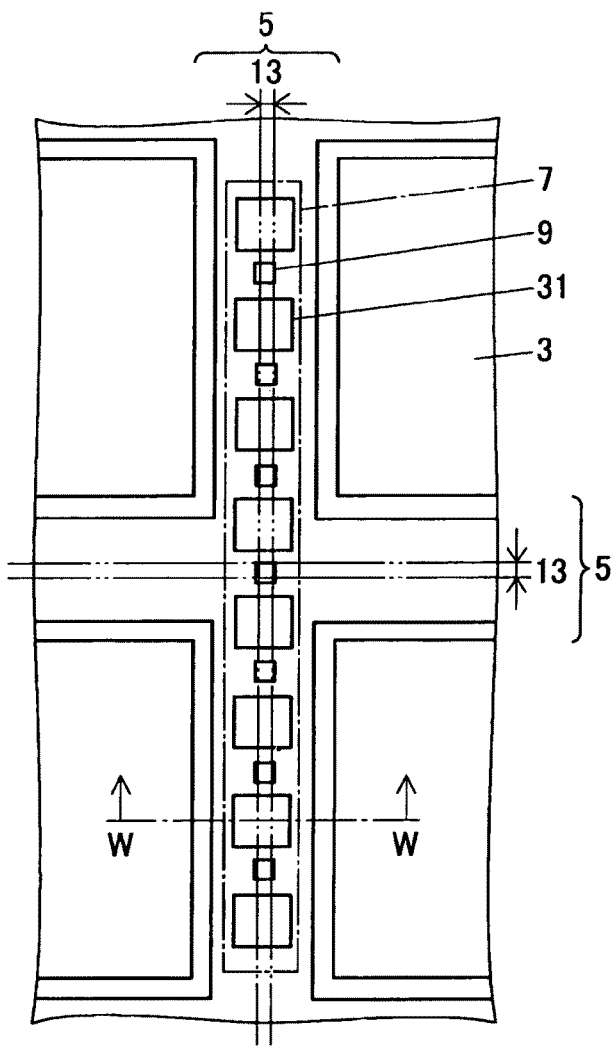
FIG. 15A is a plan view showing the vicinity of a scribe line of a conventional semiconductor wafer.
Figure 15B:
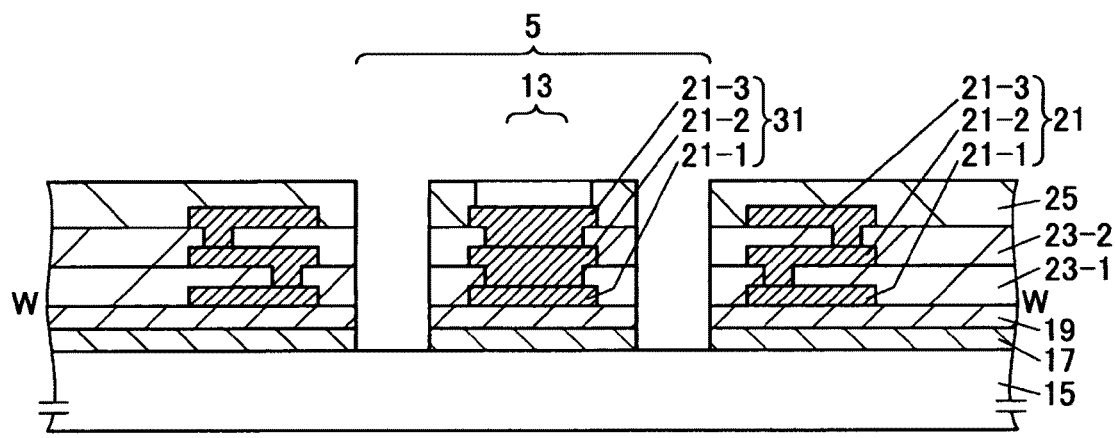
FIG. 15B is a cross-sectional view taken along line W-W of FIG. 15A.

Although the above-described embodiment of the present invention has the first metal wiring layer 21-1 formed inside the contact hole(s) 20, the present invention is not limited to such configuration. For example, a metal material different from that of the first metal wiring layer 21-1 may be formed inside the contact hole(s) 20 (See FIGS. 14A-14C). For example, a tungsten material may be formed inside the contact hole(s) 20.

With the exemplary configurations shown in FIGS. 10A-14C, the area in which the first metal wiring layer 21-1 of the process-monitor electrode pad 11 contacts the BPSG film 19 can be reduced. Accordingly, even in a case where the process-monitor electrode pad 11 is situated on the dicing area 13 of the scribe line 5, the first metal wiring layer 21-1 can be prevented from peeling. Thereby, the creation of metal burrs can be reduced.

Furthermore, since the process-monitor electrode pad 11 is arranged in the dicing area 13 in the scribe line 5, the size of the semiconductor chip 3 and the width of the scribe line 5 can be reduced.

The above-described configuration of forming a metal material different from that of the first metal wiring layer 21-1 in the contact hole(s) 20 may be applied to the exemplary configurations shown in FIGS. 5A-13C. In such cases, the peeling of the first metal wiring layer 21-1 can be prevented in the same manner as the exemplary configurations shown in FIGS. 5A-13C. Thus, the creation of metal burrs can be reduced.

Although the above-described embodiment of the present invention has the second metal wiring layer 21-2 formed in the dicing area 13, second metal wiring layer 21-2 may alternatively be formed in an area outside of the dicing area 13 (not shown). Accordingly, only the uppermost third metal wiring layer 21-3 of the metal wiring layers 21 is diced when dicing the process-monitor electrode pad 11. Therefore, the creation of metal burrs can be further reduced.

Although the above-described embodiment of the present invention has the semiconductor wafer 1 formed with a triple metal wiring layer configuration (i.e. a configuration having three metal wiring layers), the semiconductor wafer 1 of the present invention is not limited to such configuration. For example, the semiconductor wafer 1 may have a single metal wiring layer configuration, a double metal wiring layer configuration, or a configuration having four or more metal wiring layers.

Second Embodiment

Figure 16A:
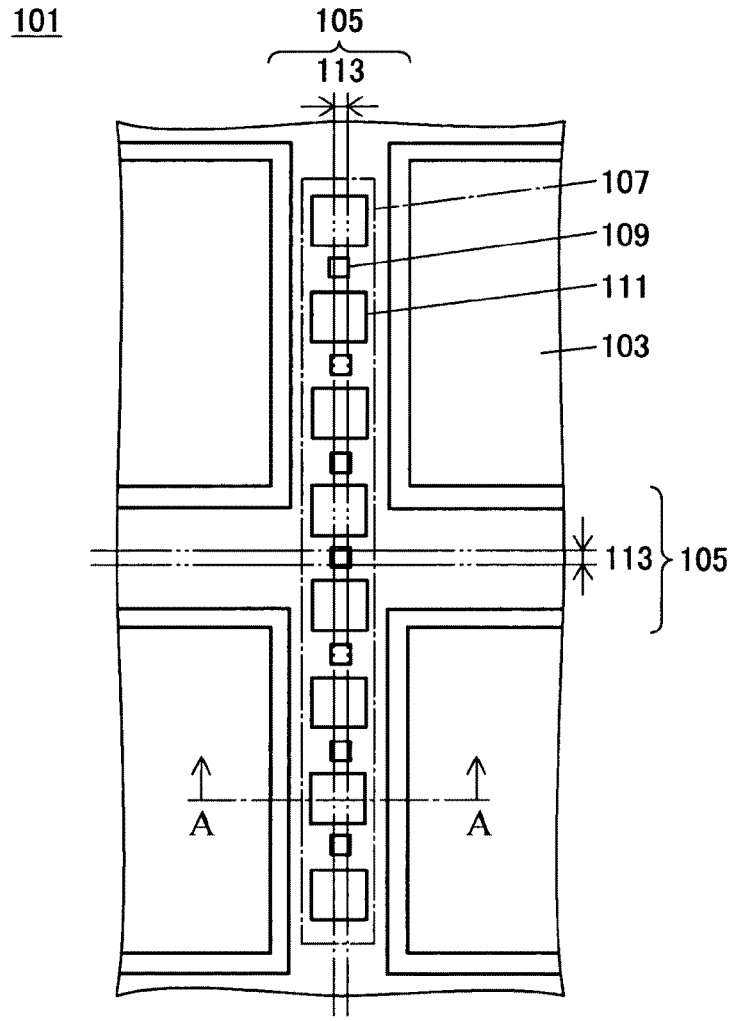
FIG. 16A is a plan view showing the vicinity of a scribe line of a semiconductor wafer according to a second embodiment of the present invention.
Figure 16B:
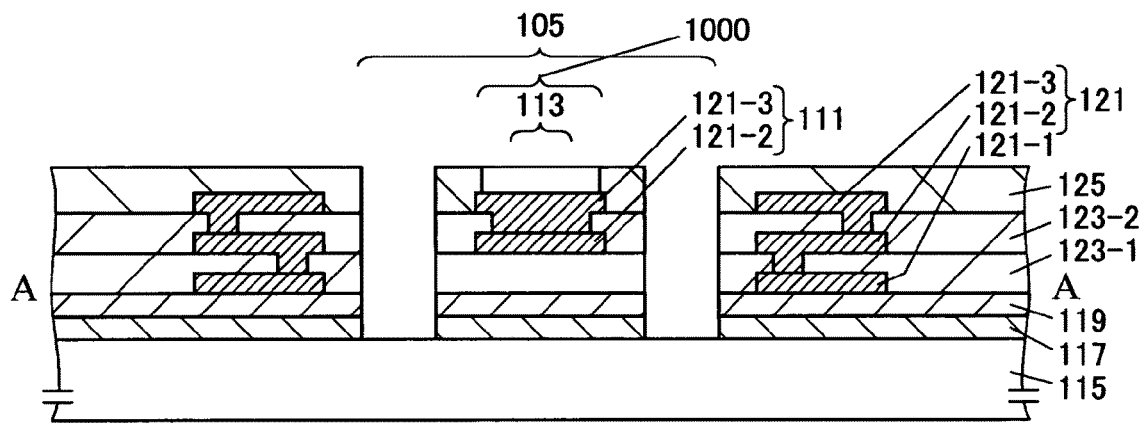
FIG. 16B is a cross-sectional view taken along line B-B of FIG. 16A.
Figure 17:
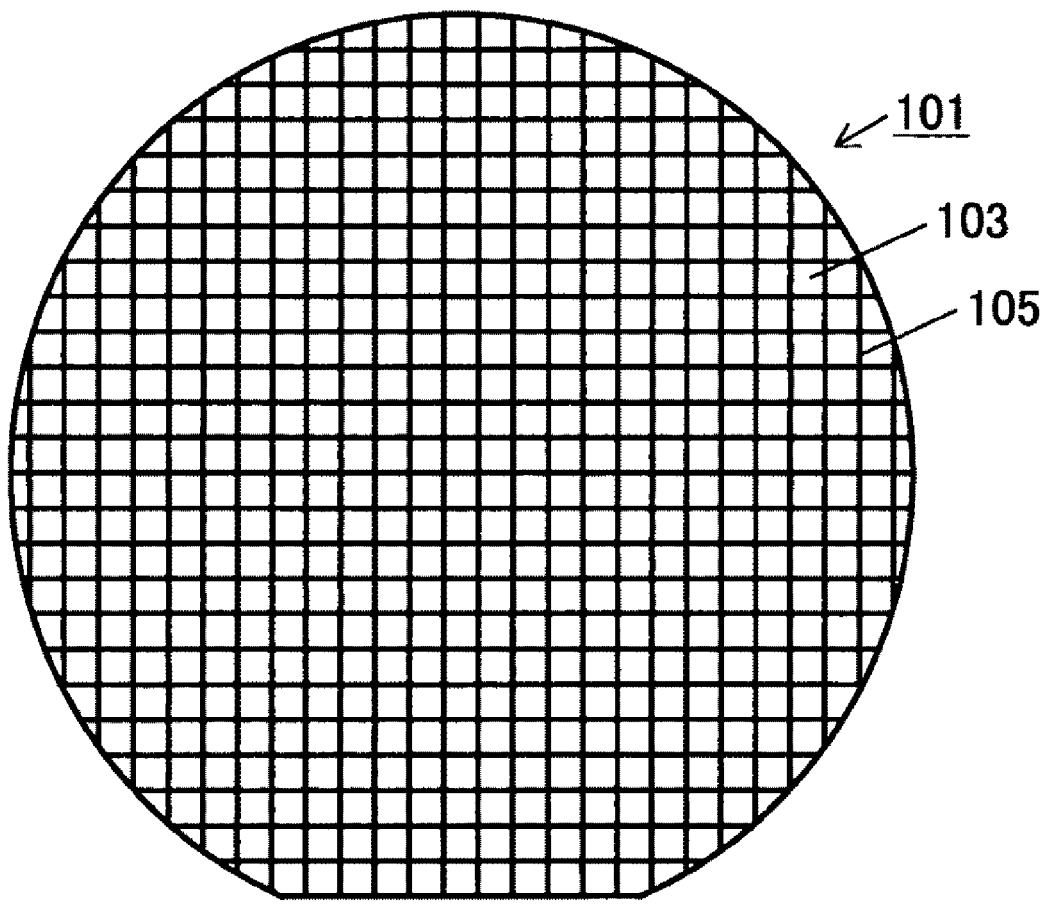
FIG. 17 is a plan view showing an overall configuration of a semiconductor wafer according to a second embodiment of the present invention.
Figure 18A:
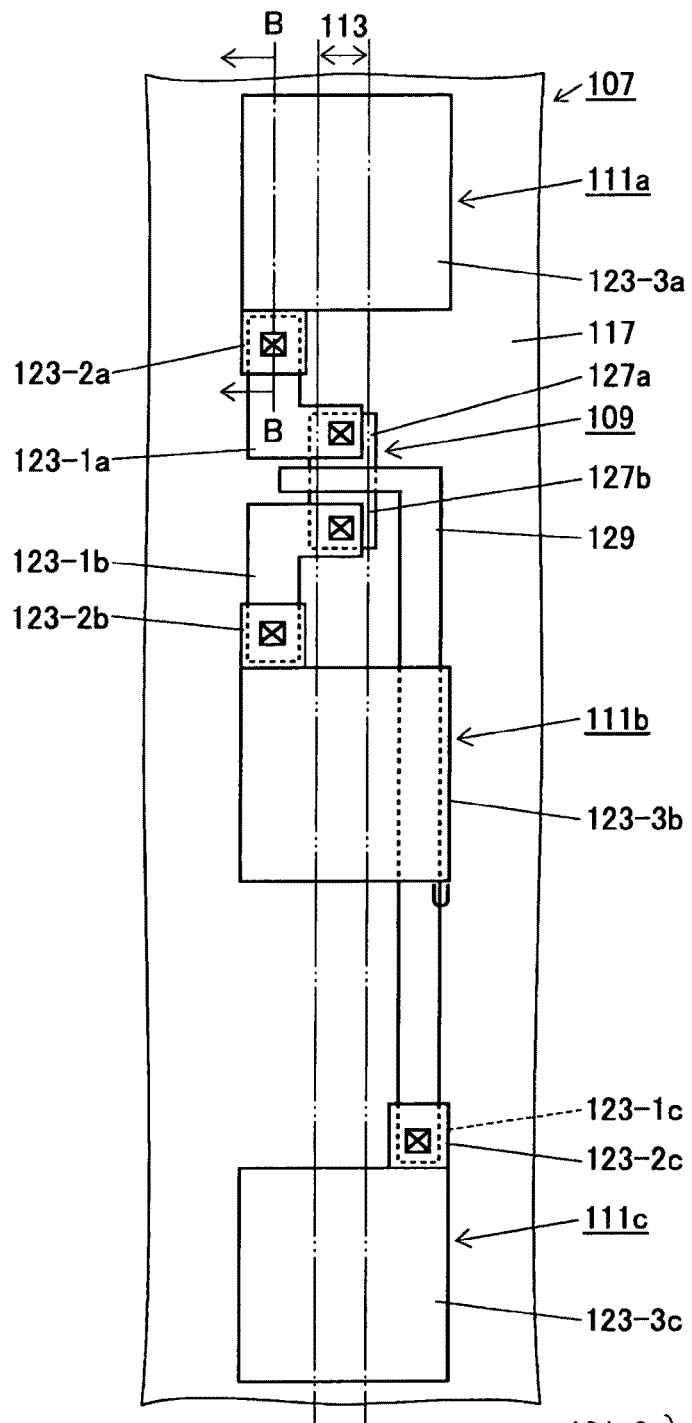
FIG. 18A is a plan view showing a portion of a process-monitoring area in a scribe line according to an embodiment of the present invention.
Figure 18B:
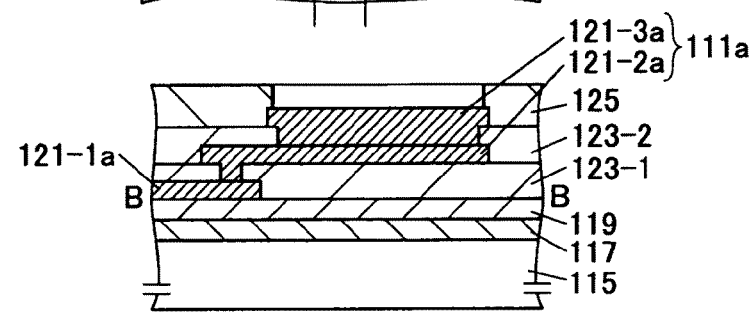
FIG. 18B is a cross-sectional view taken along line B-B of FIG. 18A.

FIGS. 16A and 16B are schematic diagrams for describing a semiconductor wafer 101 according to an embodiment of the present invention. More specifically, FIG. 16A is a plan view showing the vicinity of a scribe line 105 of the semiconductor wafer 101, and FIG. 16B is a cross-sectional view taken along line A-A of FIG. 16A. FIG. 17 is a plan view showing an overall configuration of the semiconductor wafer 101 according to an embodiment of the present invention. FIGS. 18A and 18B are schematic diagrams for describing a portion of a process monitoring device disposed on a scribe line according to an embodiment of the present invention. More specifically, FIG. 18A is a plan view showing the portion of the process monitoring device, and FIG. 18B is a cross-sectional view taken along line B-B of FIG. 18A. The semiconductor wafer 101 according to an embodiment of the present invention has a three metal layer wiring configuration.

As shown in FIG. 17, the semiconductor wafer 101 has plural semiconductor chips 103 that are divided and arranged in a matrix form by scribe lines 105. The width of the scribe line 105 in this example is 100 μm. As shown in FIG. 16A, the scribe line 105 has a process-monitoring area 107, on which plural semiconductor devices used for process monitoring (hereinafter referred to as "process-monitor semiconductor devices") 109 and plural electrode pads used for process monitoring (hereinafter referred to as "process-monitor electrode pads") 111 are arranged. The plane size of the process-monitor electrode pad 111 is, for example, 70 μm×70 μm. The center area of the scribe line 105 is the area that is diced (cut) in the dicing process (hereinafter referred to as "dicing area 113"). The width of the dicing area 113 is substantially equal to the thickness of the blade used for dicing the semiconductor wafer 101. For example, in a case where a blade having a thickness ranging from 20-40 μm is used, the width of the dicing area 113 is 20-40 μm.

Next, the cross-sectional configuration of the semiconductor wafer 101 is described with reference to FIG. 16B. In this example, a LOCOS oxide film 117 is formed on a semiconductor substrate 115 formed of a silicon material. A BPSG film 119 (i.e. poly-metal interlayer film) is formed on the LOCOS oxide film 117.

A first metal wiring layer 121-1 is formed on the BPSG film 119. The first metal wiring layer 121-1 is not formed below the process-monitor electrode pad 111. In the area illustrated in FIG. 16B, the first metal wiring layer 121-1 is formed in an annular shape along the peripheral part of the semiconductor chip 103. The first metal wiring layer 121-1 may also be formed on other areas (not shown in FIG. 16B) of the semiconductor wafer 101. The first metal wiring layer 121-1 includes a high melting point metal film (e.g. titanium film) having an aluminum alloy film (e.g. AlSiCu film) formed thereon.

A first interlayer insulation film 123-1 is formed on the BPSG film 119 including the area on which the first metal wiring layer 121-1 is formed. The first interlayer insulation film 123-1 has a layered configuration including, for example, a NSG (Non-doped Silicate Glass) film, an SOG (Spin On Glass) film, and an NSG film. An annular through-hole is formed in the first interlayer insulation film 123-1 on the first metal wiring layer 121-1 along the peripheral part of the semiconductor chip 103.

A second metal wiring layer 121-2 is formed on the first interlayer insulation film 123-1. The second metal wiring layer 121-2 is formed in the area where the process-monitor electrode pad 111 is formed. Furthermore, in the area illustrated in the drawing, the second wiring layer 121-2 is formed on the first interlayer insulation film and in the through-hole of the first interlayer insulation film 123-1. The second metal wiring layer 121-2 may also be formed on other areas (not shown in FIG. 16B) of the semiconductor wafer 101. The second metal wiring layer 121-1 may also be formed of, for example, a titanium film having an AlSiCu film formed thereon.

A second interlayer insulation film 123-2 is formed on the first interlayer insulation film 123-1 including the area on which the second metal wiring layer 121-2 is formed. The second interlayer insulation film 123-2 also has a layered configuration including, for example, a NSG film, an SOG film, and an NSG film. In the process-monitor electrode pad forming area 1000 (the area on which the process-monitor electrode pad 111 is formed), a through-hole is formed in the second interlayer insulation film 123-2 on the second metal wiring layer 121-2. An annular through-hole is also formed in the second interlayer insulation film 123-2 on the second metal wiring layer 121-2 along the peripheral part of the semiconductor chip 103.

A third metal wiring layer 121-3 is formed on the second interlayer insulation film 123-2 and in the through-hole of the second interlayer insulation film 123-2. In addition, in the area illustrated in the drawing, the third metal wiring layer 121-3 is formed in an annular shape along the peripheral part of the semiconductor chip 103. The third metal wiring layer 121-3 may also be formed on other areas (not shown in FIG. 16B) of the semiconductor wafer 101. The third metal wiring layer 121-3 may also be formed of, for example, a titanium film having an AlSiCu film formed thereon.

A final protective film 125 is formed on the second interlayer insulation film 123-2 including the area on which the third metal wiring layer 121-3 is formed. The final protective film 125 has a layered configuration including, for example, a silicon oxide film and a silicon nitride film. In the process-monitor electrode pad forming area, a pad opening part is formed in the final protective film 125. Thereby, the surface of the third metal wiring layer 121-3 is exposed.

The layered configuration including the first, second, and third metal wiring layers 121-1, 121-2, 121-3 formed along the peripheral part of the semiconductor chip 103 is a guard ring 121 serving to the guard the inside of the semiconductor chip 103.

The LOCOS oxide film 117, the BPSG film 119, the first interlayer insulation film 123-1, the second interlayer insulation film 123-2, and the final protective film 125 each have both of the their end parts (in the width direction of the scribe line 105) removed in a belt-like manner. In this example, the width of the removed end parts is 10 μm. By removing both end parts of the LOCOS oxide film 117, the BPSG film 119, the first interlayer insulation film 123-1, the second interlayer insulation film 123-2, and the final protective film 125 in the width direction of the scribe line 105, cracks which may be formed in the insulation films during the dicing of the dicing area 113 can be prevented from reaching the semiconductor chips 103. It is however to be noted that the semiconductor wafer 101 of the present invention is not limited to a configuration having both end parts removed in the width direction of the scribe line 105.

Next, the process monitoring area 107 is described with reference to FIGS. 18A and 18B. In FIG. 18B, illustration of the BPSG film 119, the first interlayer insulation film 123-1, the second interlayer insulation film 123-2, and the final protective film 125 included in the semiconductor chip 103 is omitted.

In FIG. 18A, two active regions 127a, 127b are formed as the source and drain on the surface of a semiconductor substrate area surrounded by the LOCOS oxide film 117. A gate electrode 129 made of polysilicon is formed on the semiconductor substrate in the area between the two active regions 127a, 127b via a gate insulation film. The two active regions 127a, 127b, and the gate electrode 129 together form a transistor (i.e. process-monitor semiconductor device 109). The transistor is situated in a part of the dicing area that is different from the part where the process-monitor electrode pad 111 is situated. In the example shown in FIG. 18A, the transistor is situated between a process-monitor electrode pad 111a and a process-monitor electrode pad 111b. Both ends of the polysilicon gate electrode 129 are formed in a manner extending across the LOCOS oxide film 117. One of the ends is guided to the vicinity of the process-monitor electrode pad 111c other than the part of the dicing area 113.

The first metal wiring layers 121-1a, 121-1b, and 121-1c have a width ranging from, for example, 2 μm to 3 μm.

One end of the first metal wiring layer 121-1a, which is disposed on the active region 127a, is electrically connected to the active region 127a via a contact hole. The other end of the first metal wiring layer 121-1a is disposed in the vicinity of the process-monitor electrode pad 111a other than the part of the dicing area 113.

One end of the first metal wiring layer 121-1b, which is disposed on the active region 127b, is electrically connected to the active region 127b. The other end of the second metal wiring layer 121-1b is disposed in the vicinity of the process-monitor electrode pad 111b other than the part of the dicing area 113.

The first metal wiring layer 121-1c (hidden behind the second metal wiring layer 121-2c in FIG. 18A), which is disposed on an end part of the gate electrode 129 in the vicinity of the process-monitor electrode pad 111c, is electrically connected to the gate electrode 129 via a contact hole.

Second metal wiring layers 121-2a, 121-2b, and 121-2c are formed on the first interlayer insulation film 123-1.

The second metal wiring layer 121-2a, which is formed in continuation in a corresponding position on the process-monitor electrode pad forming area and the first metal wiring layer 121-1a, is electrically connected to the first metal wiring layer 121-1a via a through-hole.

The second metal wiring layer 121-2b, which is formed in continuation in a corresponding position on the process-monitor electrode pad forming area and the first metal wiring layer 121-1b, is electrically connected to the first metal wiring layer 121-1b via a through-hole.

The second metal wiring layer 121-2c, which is formed in continuation in a corresponding position on the process-monitor electrode pad forming area and the first metal wiring layer 121-1c, is electrically connected to the first metal wiring layer 121-1c via a through-hole.

The parts of the second metal wiring layers 121-1a, 121-1b, and 121-1c protruding from the process-monitor electrode pads 111a, 111b, and 111c have a width ranging from, for example, 2 μm to 3 μm.

Third metal wiring layers 121-3a, 121-3b, and 121-3c are formed on the second interlayer insulation film 123-2.

The third metal wiring layer 121-3a, which is formed in a process-monitor electrode pad forming area (area in which the process-monitor-electrode pad 111a is formed), is electrically connected to the second metal wiring layer 121-2a via a through-hole.

The third metal wiring layer 121-3b, which is formed in a process-monitor electrode pad forming area (area in which the process-monitor-electrode pad 111b is formed), is electrically connected to the second metal wiring layer 121-2b via a through-hole.

The third metal wiring layer 121-3c, which is formed in a process-monitor electrode pad forming area (area in which the process-monitor-electrode pad 111c is formed), is electrically connected to the second metal wiring layer 121-2c via a through-hole.

Since the process-monitor electrode pad 111 according to the second embodiment of the present invention is formed with fewer metal layers compared to the semiconductor chip 103 by forming the process-monitor electrode pad 111 with the second and third wiring layers 121-2 and 121-3, the creation of metal burrs can be reduced even in a case where the process-monitor electrode pad 111 is disposed in the dicing area 113 of the scribe line 105.

Furthermore, since the process-monitor electrode pad 111 is arranged in a manner including the dicing area 113 of the scribe line 105, there is no need to increase the size of the semiconductor chip 103 or the width of the scribe line 105.

Furthermore, compared to a process-monitor electrode pad having only a single metal wiring layer formed on an uppermost layer, the process-monitor electrode pad 111 is more likely to prevent the problem of a probe piercing through the process-monitor electrode pad when testing (monitoring) the semiconductor wafer. This is due to the process-monitor electrode pad 111 having the third metal wiring layer 121-3 formed as an uppermost metal wiring layer and the second metal wiring layer 121-2 formed beneath the third metal wiring layer 121-3.

Furthermore, compared to a case where a first metal wiring layer is formed below a process-monitor electrode pad in the dicing area, the stress applied to the vicinity of the process-monitor electrode pad 111 during a dicing process can be reduced since there is no first metal wiring layer 121-1 formed below the first and second wiring layers 121-2, 121-3 of the process-monitor electrode pad 111. Thereby, the creation of metal burrs can be reduced.

Although the first metal wiring layer 121-1 (i.e. bottom-most metal wiring layer) is formed on the BPSG film 19, the process-monitor electrode pad 111 does not include the first metal wiring layer 121-1. Therefore, the problem of peeling of the process-monitor electrode pad 111, which occurs when enhancing planarization by increasing the impurity density of the BPSG film 19, can be prevented. It is however to be noted that the semiconductor wafer according to an embodiment of the present invention is not limited to a configuration having the bottommost metal wiring layer formed on the BPSG film.

Since plural contact holes 20 are formed in the BPSG film 19 below the process-monitor electrode pad 11, the BPSG film 19 and the first metal wiring layer 21-1 can make contact via the inner walls of the contact holes 20. Thereby, peeling of the first metal wiring layer 21-1 can be prevented.

Although the above-described embodiment of the present invention has the process-monitor electrode pad 111 formed with the third metal wiring layer 121-3 and the second metal wiring layer 121-2, the process-monitor electrode pad 111 may be formed with only the third metal wiring layer 121-3 (i.e. uppermost metal wiring layer). By forming the process-monitor electrode pad 111 only with the third metal wiring layer 121-3, creation of metal burr can be further reduced since only one metal wiring layer subjected to a dicing process.

In the above-described embodiment of the present invention explained with reference to FIGS. 16-18, the first metal wiring layer 121-1 is not formed below the process-monitor electrode pad 111. However, in another embodiment of the present invention, first metal wiring layers 121-1a, 121-1b may be formed below the process-monitor electrode pads 111a, 111b disposed in an area besides the dicing area 113 (i.e. different area) for achieving electric connection below the process-monitor electrode pads 111a, 111b.

Furthermore, in yet another embodiment of the present invention, first metal wiring layers 121-1a, 121-1b may be provided by forming metal wiring patterns below the process-monitor electrode pads 111a, 111b in the dicing area 113. In this case, the first metal wiring layers 121-1a, 121-1b have a width (linear width) of, for example, 2-3 µm. Since the metal wiring patterns that form the first meal wiring layers 121-1a, 121-1b have a width that is sufficiently smaller than that of the dicing area 13, the first metal wiring layers 121-1a, 121-1b do not affect the dicing process.

Figure 20A:
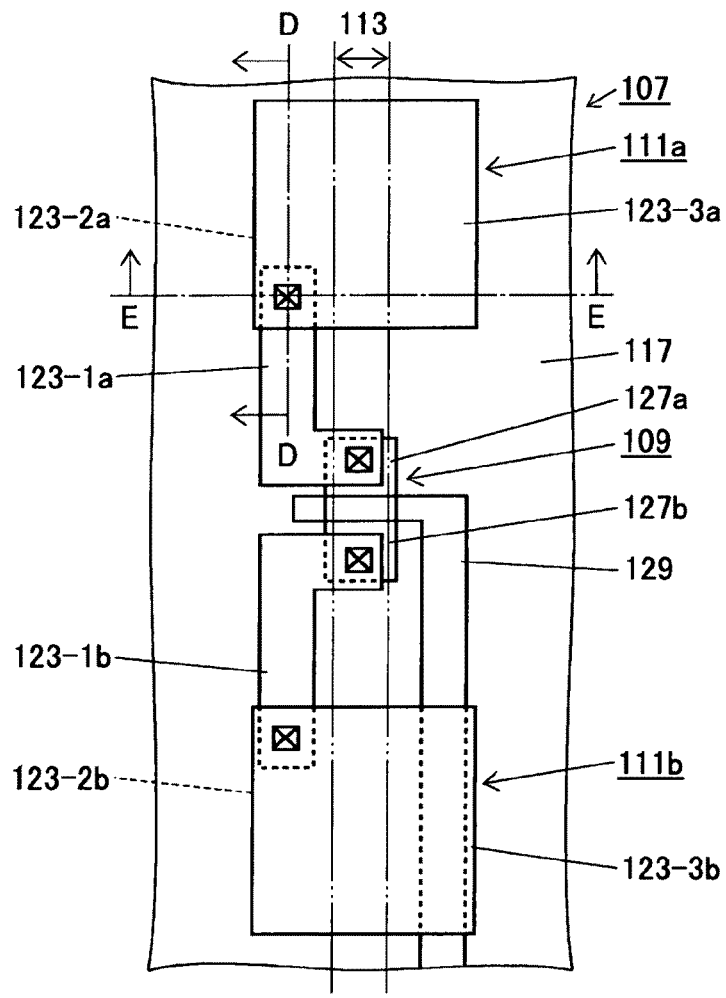
FIG. 20A is a plan view showing a portion of a process-monitoring area in a scribe line according to another embodiment of the present invention.
Figure 20B:
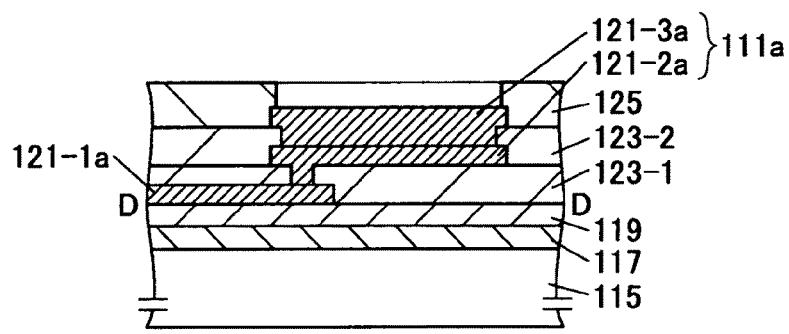
FIG. 20B is a cross-sectional view taken along line D-D of FIG. 20A.
Figure 20C:
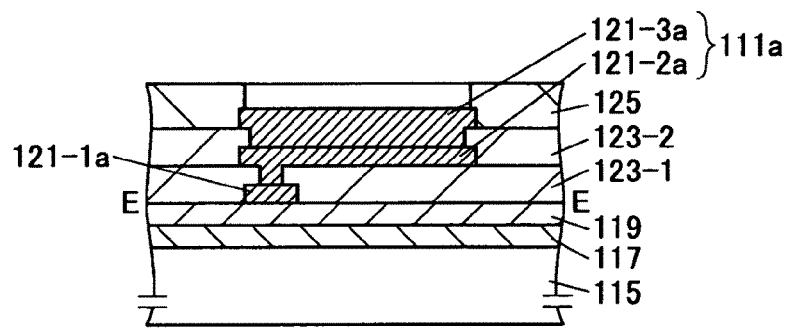
FIG. 20C is a cross-sectional view taken along line E-E of FIG. 20A.
Figure 21A:
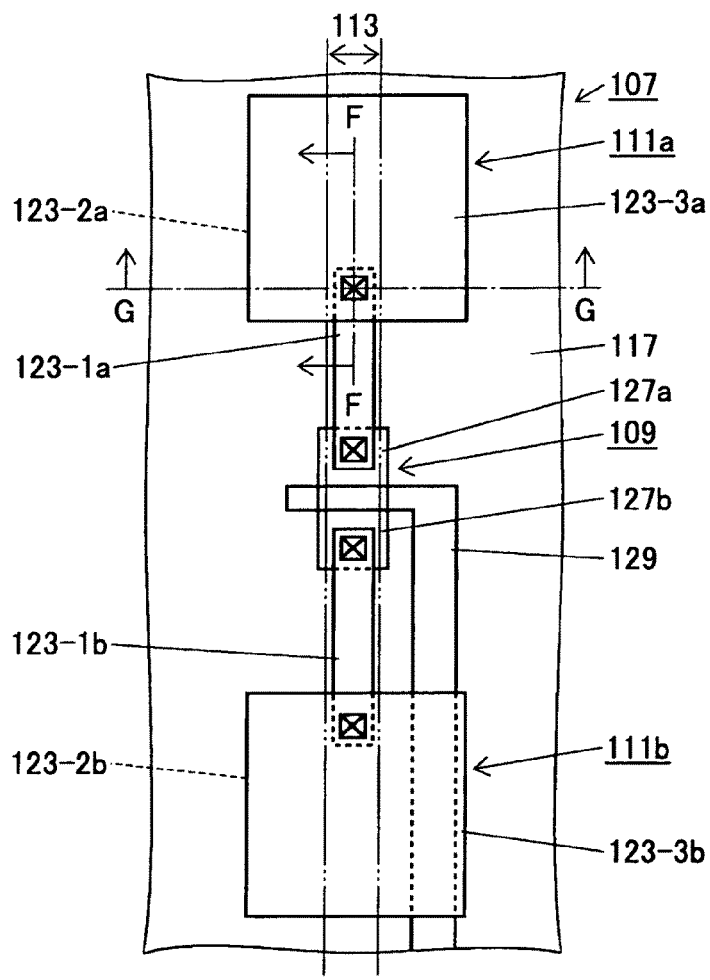
FIG. 21A is a plan view showing a portion of a process-monitoring area in a scribe line according to another embodiment of the present invention.
Figure 21B:
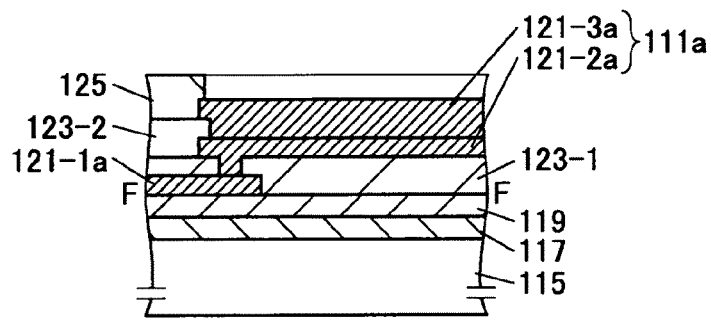
FIG. 21B is a cross-sectional view taken along line F-F of FIG. 21A.
Figure 21C:
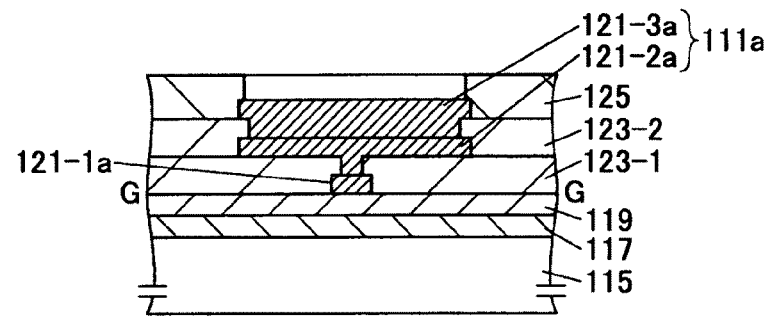
FIG. 21C is a cross-sectional view taken along line G-G of FIG. 21A.

The embodiments shown in FIGS. 20-21 may be applied with the configuration shown in FIGS. 19A and 19B where the process-monitor electrode pad 111 is formed only with the third metal wiring layer 121-3.

Although the above-described embodiment of the present invention has the semiconductor wafer 101 formed with a triple layer metal wiring configuration (i.e. a configuration having three metal wiring layers), the semiconductor wafer 101 of the present invention is not limited to such configuration. For example, the semiconductor wafer 101 may have a configuration of four or more metal wiring layers.

For example, the semiconductor wafer 101 may be formed with a four layer metal wiring configuration in which three upper layers of the process-monitor electrode pad 111 are formed with metal wiring. Thereby, the above-described advantages of the present invention can be attained. Particularly, the advantages can be attained more significantly by forming the first metal wiring layer on a BPSG film.

Furthermore, in a semiconductor wafer 101 having a metal wiring configuration of four or more layers, the process monitor electrode 111 may be formed with the two upper metal wiring layers of the semiconductor wafer 101 or with only the uppermost metal wiring layer of the semiconductor wafer 101.

Further, the present invention is not limited to these embodiments, but variations and modifications may be made without departing from the scope of the present invention.

The present application is based on Japanese Priority Application Nos. 2005-339456 and 2006-006742 filed on Nov. 24, 2005 and Jan. 13, 2006, with the Japanese Patent Office, the entire contents of which are hereby incorporated by reference.

The invention claimed is:

1. A semiconductor wafer having a scribe line dividing the semiconductor wafer into a matrix of a plurality of semiconductor chips, the semiconductor wafer including
a polysilicon layer,
a poly-metal interlayer insulation film formed on the polysilicon layer, and
a first metal wiring layer formed on the poly-metal interlayer insulation film,
the semiconductor wafer comprising:
a process-monitor electrode pad formed on a dicing area of the scribe line, the process-monitor electrode pad being formed of three metal wiring layers including the first metal wiring layer, a second metal wiring layer and a third metal wiring layer, the process-monitor electrode pad having a width greater than the width of the dicing area of the scribe line and at a same time being within the scribe line, and the process-monitor electrode pad including a plurality of contact holes formed in the poly-metal interlayer insulation film for connecting the first metal wiring layer to the polysilicon layer,
wherein the second metal wiring layer is formed directly on the first metal wiring layer, wherein the first metal wiring layer is not formed in the dicing area,
wherein the contact holes are not formed in the dicing area,
wherein the poly-metal interlayer insulation film and first metal wiring layer of the semiconductor wafer, between (a) end parts of the process-monitor electrode pad along a width direction of the scribe line and (b) respective adjacent semiconductor chip, are removed,
wherein the poly-metal interlayer insulation film is formed below the process-monitor electrode pad.

2. The semiconductor wafer as claimed in claim 1, wherein the poly-metal interlayer insulation film is a BPSG film.

3. The semiconductor wafer as claimed in claim 2, wherein the first metal wiring layer in a titanium film, and the BPSG film and the titanium film share a weak adhesion and thereby reduce occurrence of metal burrs.

4. The semiconductor wafer as claimed in claim 2, wherein the plurality of contact holes are located within the BPSG film.

5. The semiconductor wafer as claimed in claim 4, wherein the plurality of contact holes are located within the BPSG film in both longitudinal and lateral directions.

6. The semiconductor wafer as claimed in claim 1, wherein a first portion of the first metal wiring layer which is in the process-monitor electrode pad is discontinuous from a second portion of the first metal wiring layer which is a semiconductor chip adjacent, in a width direction of the scribing line, to the process-monitor electrode pad.

7. The semiconductor wafer as claimed in claim 1, further comprising a semiconductor substrate and a LOCOS oxide film disposed on the semiconductor substrate, wherein the polysilicon layer is disposed on the LOCOS oxide film.

8. The semiconductor wafer as claimed in claim 1, wherein the polysilicon layer and the plurality of contact holes are located below the process-monitor electrode pad.

9. The semiconductor wafer having a scribe line dividing the semiconductor wafer into a matrix of a plurality of semiconductor chips, the semiconductor wafer having a multi-layer metal wiring configuration including at least three metal wiring layers including a second metal wiring layer formed directly on a lowermost metal wiring layer and an uppermost metal wiring layer formed directly on the second metal wiring layer, the semiconductor wafer comprising:

a process-monitor electrode pad formed on a dicing area of the scribe line, the process-monitor electrode pad having a width greater than a width of the dicing area of the scribe line and at a same time being within the scribe line, and the process-monitor electrode pad including at least one of the metal wiring layers of the multi-layer metal wiring configuration;

wherein the lowermost metal wiring layer of the multi-layer metal wiring configuration is not formed in the process monitor electrode pad, wherein the multi-layer metal wiring configuration includes a BPSG film including a plurality of contact holes for connecting the metal wiring configuration to polysilicon layer, wherein the lowermost metal wiring layer of the multi-layer metal wiring configuration is formed on the BPSG film and the BPSG film is formed below the process-monitor electrode pad, and wherein the BPSG film and second metal wiring layer of the semiconductor wafer, between (a) end parts of the process-monitor electrode pad along a width direction of the scribe line and (b) respective adjacent semiconductor chips, are removed.

10. The semiconductor wafer as claimed in claim 9, wherein the process-monitor electrode pad includes only the uppermost metal wiring layer of the multi-layer wiring configuration.

11. The semiconductor wafer as claimed in claim 9, wherein the process-monitor electrode pad includes the uppermost metal wiring layer of the multi-layer metal wiring configuration and the second metal wiring layer formed beneath the uppermost metal wiring layer.

12. The semiconductor wafer as claimed in claim 9, where none of the metal wiring layers of the multi-layer metal wiring configuration is formed below the metal wiring layer of the process-monitor electrode pad in the dicing area of the scribe line.

* * * * *

UNITED STATES PATENT AND TRADEMARK OFFICE
CERTIFICATE OF CORRECTION

| | | |
|---|---|---|
| PATENT NO. | : 8,067,819 B2 | Page 1 of 1 |
| APPLICATION NO. | : 11/794649 | |
| DATED | : November 29, 2011 | |
| INVENTOR(S) | : Masaaki Yoshida and Satoshi Kouno | |

It is certified that error appears in the above-identified patent and that said Letters Patent is hereby corrected as shown below:

Replace item (86) on the cover page of the patent, with the following:

--(86)    PCT No.:  PCT/JP2006/323872--

Signed and Sealed this
Thirteenth Day of March, 2012

David J. Kappos
*Director of the United States Patent and Trademark Office*